US009842952B2

United States Patent
Howell et al.

(10) Patent No.: US 9,842,952 B2
(45) Date of Patent: Dec. 12, 2017

(54) PHOTOVOLTAIC CELL MODULE AND METHOD OF FORMING

(71) Applicant: Dow Corning Corporation, Midland, MI (US)

(72) Inventors: Malinda Howell, Midland, MI (US); Donnie Juen, Sanford, MI (US); Barry Ketola, Freeland, MI (US); Mary Kay Tomalia, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/630,998

(22) Filed: Feb. 25, 2015

(65) Prior Publication Data

US 2015/0171249 A1 Jun. 18, 2015

Related U.S. Application Data

(63) Continuation of application No. 13/126,603, filed as application No. PCT/US2009/062513 on Oct. 29, 2009, now abandoned.
(Continued)

(51) Int. Cl.
*H01L 31/042* (2014.01)
*H01L 31/048* (2014.01)
(Continued)

(52) U.S. Cl.
CPC .... *H01L 31/0481* (2013.01); *B32B 17/10018* (2013.01); *B32B 17/10798* (2013.01);
(Continued)

(58) Field of Classification Search
CPC ............... H01L 31/048; H01L 31/0481; H01L 31/0487; H01L 31/049; H01L 31/02167; Y02E 10/542; Y02E 10/549
(Continued)

(56) References Cited

U.S. PATENT DOCUMENTS 3,419,593 A 12/1968 Willing
3,971,884 A 7/1976 Meeks et al.
(Continued)

FOREIGN PATENT DOCUMENTS

CN 1816916 A 8/2006
EP 1 070 734 A2 1/2001
(Continued)

OTHER PUBLICATIONS

English language abstract for KR 2006-0035733 extracted from espacenet.com database on Nov. 4, 2015, 2 pages.
(Continued)

*Primary Examiner* — Matthew Martin
*Assistant Examiner* — Dujuan Horton
(74) *Attorney, Agent, or Firm* — Howard & Howard Attorneys PLLC

(57) ABSTRACT

A photovoltaic cell module, a photovoltaic array including at least two modules, and a method of forming the module are provided. The module includes a first outermost layer and a photovoltaic cell disposed on the first outermost layer. The module also includes a second outermost layer disposed on the photovoltaic cell and sandwiching the photovoltaic cell between the second outermost layer and the first outermost layer. The method of forming the module includes the steps of disposing the photovoltaic cell on the first outermost layer, disposing a silicone composition on the photovoltaic cell, and compressing the first outermost layer, the photovoltaic cell, and the second layer to form the photovoltaic cell module.

18 Claims, 4 Drawing Sheets

Related U.S. Application Data

(60) Provisional application No. 61/110,429, filed on Oct. 31, 2008.

(51) Int. Cl.
*B32B 17/10* (2006.01)
*H01L 31/18* (2006.01)
*H01L 31/049* (2014.01)
*H01L 31/0216* (2014.01)

(52) U.S. Cl.
CPC ............ *H01L 31/049* (2014.12); *H01L 31/18* (2013.01); *B32B 2327/12* (2013.01); *H01L 31/02167* (2013.01); *Y02E 10/542* (2013.01); *Y02E 10/549* (2013.01); *Y02P 70/521* (2015.11)

(58) Field of Classification Search
USPC ........................................ 136/259, 244, 251
See application file for complete search history.

(56) References Cited

U.S. PATENT DOCUMENTS

| | | | |
|---|---|---|---|
| 4,057,439 | A | 11/1977 | Lindmayer |
| 4,322,261 | A | 3/1982 | Dubois |
| 4,340,709 | A | 7/1982 | Jeram et al. |
| 4,510,094 | A | 4/1985 | Drahnak |
| 4,530,879 | A | 7/1985 | Drahnak |
| 4,686,137 | A | 8/1987 | Ward, Jr. et al. |
| 4,766,176 | A | 8/1988 | Lee et al. |
| 4,840,796 | A | 6/1989 | Sweet et al. |
| 5,017,654 | A | 5/1991 | Togashi et al. |
| 5,145,933 | A | 9/1992 | Grisoni et al. |
| 5,474,620 | A | 12/1995 | Nath et al. |
| 5,496,961 | A | 3/1996 | Dauth et al. |
| 5,574,073 | A | 11/1996 | Juen et al. |
| 5,741,370 | A | 4/1998 | Hanoka |
| 6,020,409 | A | 2/2000 | Alvarez et al. |
| 6,127,622 | A | 10/2000 | Yamada et al. |
| 6,133,522 | A * | 10/2000 | Kataoka ............ B32B 17/10788 136/251 |
| 6,169,155 | B1 | 1/2001 | Alvarez et al. |
| 6,320,115 | B1 | 11/2001 | Kataoka et al. |
| 6,469,242 | B1 | 10/2002 | Kondo |
| 6,793,759 | B2 | 9/2004 | Chaudhury et al. |
| 7,671,006 | B2 | 3/2010 | Company et al. |
| 8,847,064 | B2 | 9/2014 | Terreau et al. |
| 2001/0017102 | A1 | 8/2001 | Caldwell |
| 2002/0012678 | A1 | 1/2002 | Narang |
| 2002/0048680 | A1 | 4/2002 | Yamanaka |
| 2005/0224108 | A1 | 10/2005 | Cheung |
| 2006/0166023 | A1 | 7/2006 | Yoshikata et al. |
| 2006/0207646 | A1 | 9/2006 | Terreau et al. |
| 2007/0012351 | A1 | 1/2007 | Horemans |
| 2007/0295385 | A1* | 12/2007 | Sheats ................. H01L 31/0392 136/251 |
| 2008/0017241 | A1 | 1/2008 | Anderson et al. |
| 2008/0276983 | A1 | 11/2008 | Drake et al. |
| 2009/0255571 | A1 | 10/2009 | Xia et al. |

FOREIGN PATENT DOCUMENTS

| | | |
|---|---|---|
| EP | 1 267 419 A2 | 12/2002 |
| EP | 1 254 192 B1 | 8/2004 |
| EP | 1 458 035 A2 | 9/2004 |
| FR | 2 426 337 A1 | 12/1979 |
| JP | H 09-001680 A | 1/1997 |
| JP | 1997-064391 A | 3/1997 |
| JP | H 09-069646 A | 3/1997 |
| JP | H 10-209473 A | 8/1998 |
| JP | 2003-324211 A | 11/2003 |
| JP | 2004-269727 A | 9/2004 |
| JP | 2004-292194 A | 10/2004 |
| JP | 2007-091962 A | 4/2007 |
| JP | 2007-091963 A | 4/2007 |
| JP | 2007-091964 A | 4/2007 |
| JP | 2007-168150 A | 7/2007 |
| JP | 2007-527109 A | 9/2007 |
| KR | 2006-0035733 A | 4/2006 |
| KR | 2008-0072834 A | 8/2008 |
| TW | 2008-18528 A | 4/2008 |
| WO | WO 00/46817 A1 | 8/2000 |
| WO | WO 2005/006451 A1 | 1/2005 |
| WO | WO 2007/120197 A2 | 10/2007 |
| WO | WO 2008/088570 A1 | 7/2008 |
| WO | WO 2009/129068 A2 | 10/2009 |

OTHER PUBLICATIONS

English language abstract for KR 2008-0072834 extracted from espacenet.com database on Nov. 4, 2015, 1 page.
English language abstract and machine-assisted English translation for JPH 09-001680 extracted from espacenet.com database on Apr. 13, 2015, 21 pages.
English language abstract and machine-assisted English translation for JP 2004-269727 extracted from espacenet.com database on Apr. 13, 2015, 29 pages.
English language abstract and machine-assisted English translation for JP 2007-091962 extracted from espacenet.com database on Apr. 13, 2015, 24 pages.
English language abstract and machine-assisted English translation for JP 2007-091963 extracted from espacenet.com database on Apr. 13, 2015, 24 pages.
English language abstract and machine-assisted English translation for JP 2007-091964 extracted from espacenet.com database on Apr. 13, 2015, 28 pages.
English language abstract and machine-assisted English translation for JP 2007-168150 extracted from espacenet.com database on Apr. 13, 2015, 31 pages.
International Search Report for Application No. PCT/US2009/062513 dated Nov. 22, 2010, 4 pages.
Guo et al., "Highly Active Visible-Light Photocatalysts for Curing a Ceramic Precursor," Chem. Mater., 1998, 10, 531-536.
English language abstract and machine-assisted English translation for CN 1816916 extracted from espacenet.com database on Nov. 26, 2014, 78 pages.
English language abstract for FR 2426337 extracted from the espacenet.com database on Sep. 6, 2011, 8 pages.
English language abstract and translation for JP 1997-064391 extracted from a machine translation in Tsukuba, Japan, 28 pages.
English language abstract and machine-assisted English translation for JP H09-069646 extracted from the PAJ database on Dec. 19, 2013, 25 pages.
English language abstract for JPH 10-209473 extracted from espacenet.com on Apr. 24, 2014, 18 pages.
English language abstract and machine-assisted English translation for JP 2003-324211 extracted from the PAJ database on Apr. 24, 2014, 28 pages.
English language abstract and machine-assisted English translation for JP 2004-292194 extracted from the PAJ database on Apr. 24, 2014, 50 pages.
English language abstract not available for JP 2007-527109; however, see English language equivalent US 2006/0207646. Original document extracted from the espacenet.com database on Dec. 19, 2013, 43 pages.
English language abstract for TW 200818528 extracted from espacenet.com database on Dec. 17, 2014, 2 pages.

* cited by examiner

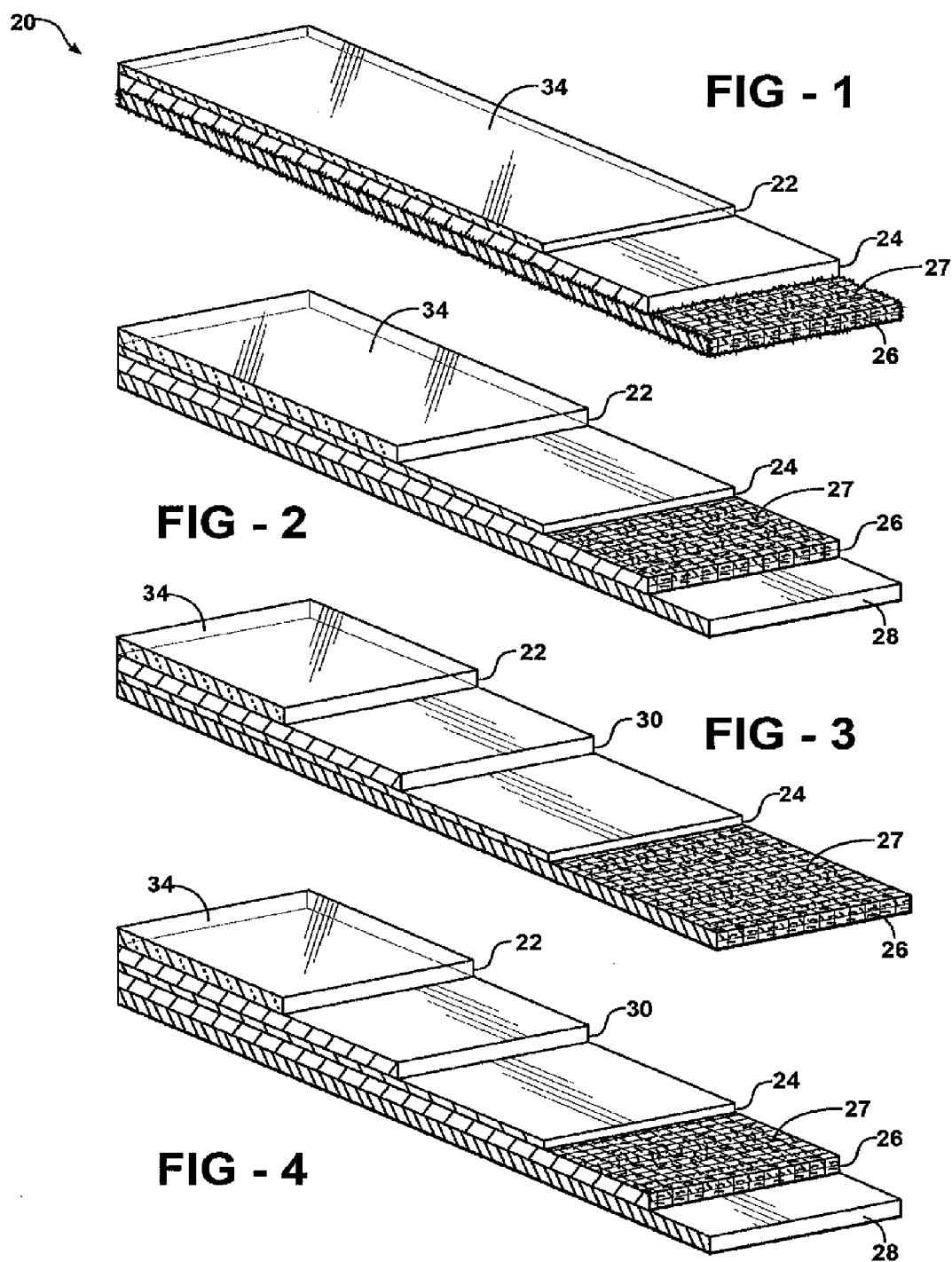

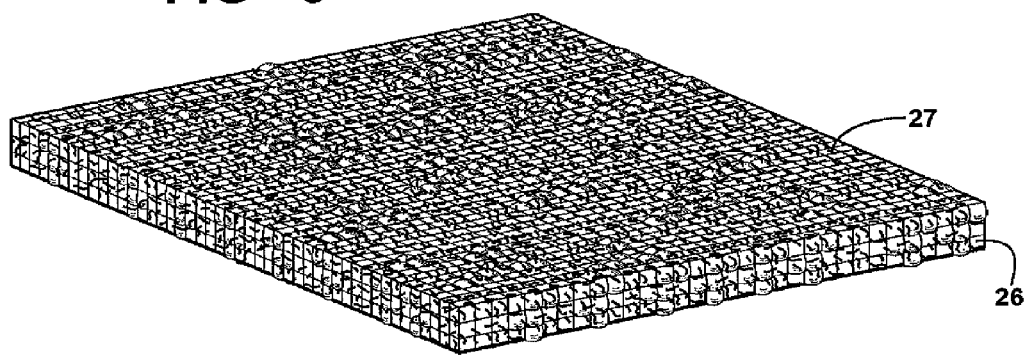
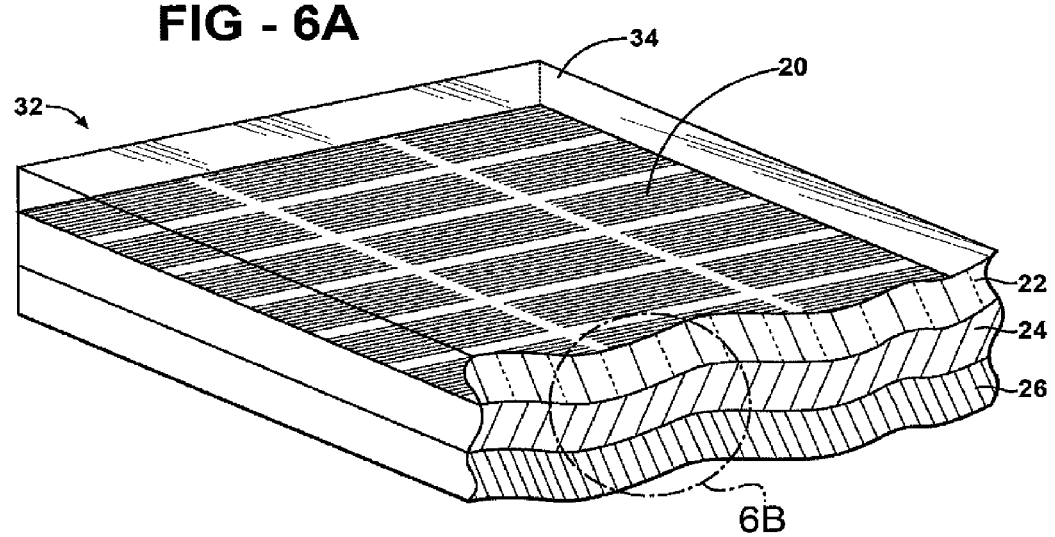

PHOTOVOLTAIC CELL MODULE AND METHOD OF FORMING

RELATED APPLICATIONS

This application is a continuation of U.S. patent application Ser. No. 13/126,603 filed on Apr. 28, 2011, which is a United States national phase of International Patent Application No. PCT/US2009/062513 filed Oct. 29, 2009, which claims priority to U.S. Provisional Application No. 61/110,429 filed Oct. 31, 2008, the disclosures of which are hereby incorporated by reference in their entirety.

GOVERNMENT LICENSE RIGHTS

This invention was made with government support under NREL Subcontract No. ZAX-5-33628-02, Prime Contract No: DE-AC36-99GO10337 awarded by the Department of Energy. The government has certain rights in the invention.

FIELD OF THE INVENTION

The present invention generally relates to a photovoltaic cell module and a photovoltaic array. More specifically, the present invention relates to a photovoltaic cell module including a first outermost layer, a photovoltaic cell, and a second outermost layer that has particular properties and that is disposed on the photovoltaic cell sandwiching the photovoltaic cell between the second outermost layer and the first outermost layer. The present invention also relates to a method of forming a photovoltaic cell module.

DESCRIPTION OF THE RELATED ART

Solar or photovoltaic cells are semiconductor devices used to convert light into electricity. There are two general types of photovoltaic cells, wafers and thin films. Wafers are thin sheets of semiconductor material that are typically formed from mechanically sawing the wafer from a single crystal or multicrystal ingot. Alternatively, wafers can be formed from casting. Thin film photovoltaic cells usually include continuous layers of semi-conducting materials deposited on a substrate using sputtering or chemical vapor deposition processing techniques.

Typically, the photovoltaic cells are included in photovoltaic cell modules (modules) that also include tie layers, substrates, superstrates, and/or additional materials that provide strength and stability. Some modules include glass substrates bonded to glass superstrates using thick tie layers. These types of modules are usually made using processes that are slow and inefficient due to a need to control the dispersion of the tie layers and to minimize leakage of the tie layers from the substrates and superstrates to reduce waste. Other types of modules are formed using copious amounts of tie layers that are pushed out from between the substrate and the superstrate and are discarded. In both types of modules, it is difficult to control a thickness of the tie layers because the tie layers can flow across the substrates and superstrates in inconsistent patterns. Additionally, methods of forming both types of modules results in increased expense, increased processing times, and increased processing complexity. These all result in increased cost for the end purchaser. Accordingly, there remains an opportunity to develop an improved photovoltaic cell module, a photovoltaic array of modules, and a method of forming the modules.

SUMMARY OF THE INVENTION AND ADVANTAGES

The instant invention provides a photovoltaic cell module and a method of forming the module. The photovoltaic cell module includes a first outermost layer having a light transmittance of at least 70 percent as determined by UV/Vis spectrophotometry using ASTM E424-71. A photovoltaic cell is disposed on the first outermost layer. The module also includes a second outermost layer opposite the first outermost layer. The second outermost layer includes a silicone composition. The second outermost layer is disposed on the photovoltaic cell and sandwiches the photovoltaic cell between the second outermost layer and the first outermost layer.

A photovoltaic cell module is formed by a method of this invention. In one embodiment, the method includes the steps of disposing the photovoltaic cell on the first outermost layer, disposing a silicone composition on the photovoltaic cell, at least partially coating a plurality of fibers with the silicone composition to form a second layer, and compressing the first outermost layer, the photovoltaic cell, and the second layer to form the module. Relative to this embodiment, the plurality of fibers extends laterally across the second layer to a periphery of the module on both ends of the module. As such, the plurality of fibers is able to resist leakage of the silicone composition from the module during the step of compressing.

The second (outermost) layer allows the photovoltaic cell to be secured within the module while simultaneously minimizing an amount of the silicone composition that must be used. If utilized, the plurality of fibers of the second (outermost) layer controls dispersion of the silicone composition and a resulting thickness of the module and also minimizes loss or leakage of the silicone composition outside of the module such as during the step of compressing. The plurality of fibers, in conjunction with the silicone composition, also provides structural strength to the module, decreases flammability of the module, and increases adhesion strength between the photovoltaic cell and the first outermost layer. The plurality of fibers and the silicone composition also allow the module to be rigid, semi-rigid, or flexible while maintaining electrical efficiency and structural integrity. Still further, the plurality of fibers allows for cost effective and repeatable production of the module because of controlled diffusion of the silicone composition, minimization of the amount of silicone composition used, minimized waste, and increased consistency of thickness and size of the module. The plurality of fibers and the silicone composition also allow for formation of a module without a supporting layer thereby reducing costs, production complexities, and time needed to form the module.

BRIEF DESCRIPTION OF THE SEVERAL VIEWS OF THE DRAWINGS

Other advantages of the present invention will be readily appreciated, as the same becomes better understood by reference to the following detailed description when considered in connection with the accompanying drawings wherein:

FIG. 1 is a side cross-sectional view of a first photovoltaic cell module including a first outermost layer, a photovoltaic cell disposed on the first outermost layer, and a second outermost layer disposed on the photovoltaic cell;

FIG. 2 is a side cross-sectional view of a second photovoltaic cell module formed from the method of this invention and including a first outermost layer, a photovoltaic cell disposed on the first outermost layer, a second layer disposed on the photovoltaic cell, and a supporting layer disposed on the second layer as a second outermost layer;

FIG. 3 is a side cross-sectional view of a third photovoltaic cell module including a first outermost layer, a tie layer disposed on, and in direct contact with, the first outermost layer, a photovoltaic cell disposed on, and spaced apart from, the first outermost layer, and a second outermost layer disposed on the photovoltaic cell;

FIG. 4 is a side cross-sectional view of a fourth photovoltaic cell module formed from the method of this invention including a first outermost layer, a tie layer disposed on, and in direct contact with, the first outermost layer, a photovoltaic cell disposed on, and spaced apart from, the first outermost layer, a second layer disposed on the photovoltaic cell, and a supporting layer disposed on, and in direct contact with, the second layer as a second outermost layer;

FIG. 5 is a side cross-sectional view of a second (outermost) layer including a plurality of fibers that are at least partially coated with the silicone composition of this invention;

FIG. 6A is a side cross-sectional view of a series of photovoltaic cell modules of FIG. 1 that are electrically connected and arranged as a photovoltaic array;

DETAILED DESCRIPTION OF THE INVENTION

Figure 6B:
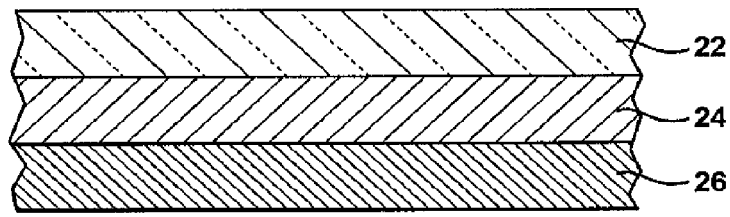
FIG. 6B is a magnified side cross-sectional view of the series of photovoltaic cell modules of FIG. 1 that are electrically connected and arranged as a photovoltaic array.

The present invention provides a photovoltaic cell module 20 (hereinafter referred to as "module") generally shown in FIGS. 1-4, 6A/B, and 7-11 and a method of forming the module 20. As is known in the art, modules 20 convert light energy into electrical energy due to a photovoltaic effect. More specifically, modules 20 perform two primary functions. A first function is photogeneration of charge carriers such as electrons and holes in light absorbing materials. The second function is direction of the charge carriers to a conductive contact to transmit electricity.

The module 20 of the instant invention can be used in any industry including, but not limited to, automobiles, small electronics, remote area power systems, satellites, space probes, radiotelephones, water pumps, grid-tied electrical systems, batteries, battery chargers, photoelectrochemical applications, polymer solar cell applications, nanocrystal solar cell applications, and dye-sensitized solar cell applications. In one embodiment, a series of modules 20 are electrically connected and form a photovoltaic array 32, as set forth in FIG. 6A. Photovoltaic arrays 32 are typically used on rooftops, in rural areas connected to battery backups, and in DC pumps, signal buoys, and the like. The photovoltaic array 32 of the instant invention may be planar or non-planar and typically functions as a single electricity producing unit wherein the modules 20 are interconnected in such a way as to generate voltage.

The module 20 includes a first outermost layer 22 that has a light transmittance of at least 70 percent as determined using UV/Vis spectrophotometry using ASTM E424-71. In one embodiment, the first outermost layer 22 has a light transmittance of at least 80 percent. In an alternative embodiment, the first outermost layer 22 has a light transmittance of at least 90 percent. In still another embodiment, the first outermost layer 22 has a light transmittance of approximately 100 percent.

Typically, the first outermost layer 22 provides protection to a front surface 34 of the module 20, as shown in FIGS. 1-4, 6A, and 8-11. Similarly, the first outermost layer 22 may provide protection to a back surface of the module 20. The first outermost layer 22 may be soft and flexible or may be rigid and stiff. Alternatively, the first outermost layer 22 may include rigid and stiff segments while simultaneously including soft and flexible segments. In one embodiment, the first outermost layer 22 includes glass. In another embodiment, the first outermost layer 22 includes an organic polymer. The organic polymer may be selected from the group of, but is not limited to, polyimides, ethylene-vinyl acetate copolymers, and/or organic fluoropolymers including, but not limited to, ethylene tetrafluoroethylene (ETFE), polyethylene terephthalate (PET) alone or at least partially coated with silicon and oxygen based materials ($SiO_x$), and combinations thereof. The first outermost layer 22 may alternatively include silicone, may consist essentially of silicone and not include organic monomers or polymers, or may consist of silicone. Of course it is to be understood that the first outermost layer 22 is not limited to the aforementioned compounds and may include any compound or composition known in the art so long as the first outermost layer 22 has a light transmittance of at least 70 percent using ASTM E424-71.

The first outermost layer 22 may be load bearing or non load bearing and may be included in any portion of the module 20. The first outermost layer 22 may be a "top layer," also known as a superstrate, or a "bottom layer", also known as a substrate, of the module 20. Bottom layers are typically positioned behind photovoltaic cells 24 and serve as mechanical support. Relative to the method of this invention, the module 20 may include a first outermost layer 22 as a top layer and an additional layer that also has a light transmittance of at least 70 percent using ASTM E424-71 as a bottom layer of the module 20 as a superstrate. The additional layer may be the same as or different from the first outermost layer 22. Typically, the first outermost layer 22 is positioned on a top of the module 20 and in front of a light source. Both the first outermost layer 22 and the additional layer may be used to protect the module 20 from environmental conditions such as rain, show, and heat. In one embodiment, the first outermost layer 22 has a length and width of 125 mm each. In another embodiment, the first outermost layer 22 has a length and width of 156 mm each. Of course it is to be understood that the first outermost layer 22, and the instant invention, are not limited to these dimensions.

Figure 10:
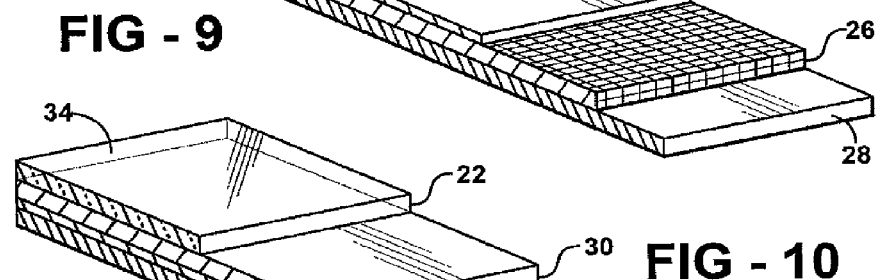
FIG. 10 is a side cross-sectional view of a photovoltaic cell module including a first outermost layer, a tie layer disposed on, and in direct contact with, the first outermost layer, a photovoltaic cell disposed on, and spaced apart from, the first outermost layer, and a second outermost layer disposed on the photovoltaic cell wherein the second outermost layer is free of a plurality of fibers and is formed from a hydrosilylation-curable silicone composition.

In addition to the first outermost layer 22, the module 20 also includes a photovoltaic cell 24. The photovoltaic cell 24 is disposed on the first outermost layer 22. In one embodiment, the photovoltaic cell 24 is disposed directly on the first outermost layer 22, i.e., in direct contact with the first outermost layer 22, as shown in FIGS. 1, 2, 6A/B, 8 and 9. In another embodiment, the photovoltaic cell 24 is spaced apart from the first outermost layer 22 as shown in FIGS. 3 and 4 and 10 and 11. The photovoltaic cell 24 may be disposed on, and in direct contact with (i.e., directly applied to), the first outermost layer 22 via chemical vapor deposition and/or physical sputtering. Alternatively, the photovoltaic cell 24 may be formed apart from the first outermost layer 22 and/or the module 20 and later disposed on the first outermost layer 22. In one embodiment, the photovoltaic cell 24 is be sandwiched between the second (outermost) layer 26 and a tie layer 30, as described in greater detail below and as shown in FIG. 3 and FIG. 10. It is to be appreciated that the terminology "second (outermost)" may apply to both the second outermost layer and the second layer.

The photovoltaic cell 24 typically has a thickness of from 50 to 250, more typically of from 100 to 225, and most typically of from 175 to 225, micrometers. In one embodiment, the photovoltaic cell 24 has a length and width of 125 mm each. In another embodiment, the photovoltaic cell 24 has a length and width of 156 mm each. Of course it is to be understood that the photovoltaic cell 24, and the instant invention, are not limited to these dimensions.

The photovoltaic cell 24 may include large-area, single-crystal, single layer p-n junction diodes. These photovoltaic cells 24 are typically made using a diffusion process with silicon wafers. Alternatively, the photovoltaic cell 24 may include thin epitaxial deposits of (silicon) semiconductors on lattice-matched wafers. In this embodiment, the photovoltaic cell 24 may be classified as either space or terrestrial and typically has AM0 efficiencies of from 7 to 40%. Further, the photovoltaic cell 24 may include quantum well devices such as quantum dots, quantum ropes, and the like, and also include carbon nanotubes. Without intending to be limited by any particular theory, it is believed that these types of photovoltaic cells 24 can have up to a 45% AM0 production efficiency. Still further, the photovoltaic cell 24 may include mixtures of polymers and nano particles that form a single multi-spectrum layer which can be stacked to make multi-spectrum solar cells more efficient and less expensive.

The photovoltaic cell 24 may include amorphous silicon, monocrystalline silicon, polycrystalline silicon, microcrystalline silicon, nanocrystalline silica, cadmium telluride, copper indium/gallium selenide/sulfide, gallium arsenide, polyphenylene vinylene, copper phthalocyanine, carbon fullerenes, and combinations thereof in ingots, ribbons, thin films, and/or wafers. The photovoltaic cell 24 may also include light absorbing dyes such as ruthenium organometallic dyes. Most typically, the photovoltaic cell 24 includes monocrystalline and polycrystalline silicon.

The photovoltaic cell 24 has a first side and a second side. Typically the first side is opposite the second side. However, the first and second sides may be adjacent each other. A first electrical lead is typically disposed on the first side while a second electrical lead is typically disposed on the second side. One of the first and second electrical leads typically acts as an anode while the other typically acts as a cathode. The first and second electrical leads may be the same or may be different and may include metals, conducting polymers, and combinations thereof. In one embodiment, the first and second electrical leads include tin-silver solder coated copper. In another embodiment, the first and second electrical leads include tin-lead solder coated copper.

The first and second electrical leads may be disposed on any part of the first and second sides of the photovoltaic cell 24. The first and second electrical leads may be of any size and shape and typically are rectangular-shaped and have dimensions of approximately 0.005 to 0.080 inches in length and/or width. The first and second electrical leads typically connect the module 20 to additional modules 20 in a photovoltaic array 32, as shown in FIG. 6A. The modules 20 may be connected in series or in parallel.

The module 20 also includes the second (outermost) layer 26 disposed on the photovoltaic cell 24. More specifically, the module 22, as set forth in FIGS. 1, 3, 6A/B, and 8-11 includes the second (outermost) layer 26. The module 22, including the second (outermost) layer 26, has sufficient strength and rigidity without use of any supporting layer 28, described in greater detail below. In other words, the module 22 may include the second (outermost) layer 26 as the bottom-most layer and not include any additional layers apart from the photovoltaic cell 24 and the first outermost layer 22.

However, relative to the method of this invention, the module 22 that is formed may include the second layer 26 as an outermost layer or as an interior layer. Relative to the instant invention, the second (outermost) layer 26 may bind the first outermost layer 22 to the photovoltaic cell 24 and/or at least partially encapsulate the photovoltaic cell 24. The second (outermost) layer 26 may be disposed directly on the photovoltaic cell 24, i.e., in direct contact with the photovoltaic cell 24, as shown in FIGS. 1-4, 6A/B, and 8-11, or may be spaced apart from the photovoltaic cell 24. In various embodiments, the second (outermost) layer 26 is further defined as a controlled bead disposed on the photovoltaic cell 24. In various embodiments, the second (outermost) layer 26 is a controlled bead of the liquid silicone composition. The controlled bead is typically applied in a rectangular shape. However, the controlled bead may be formed in any shape. Typically, the controlled bead is in contact with an interior portion of the first outermost layer 22, the photovoltaic cell 24, or both the first outermost layer 22 and the photovoltaic cell 24 thereby leaving a space along a perimeter of the first outermost layer 22, the photovoltaic cell 24, or both the first outermost layer 22 and the photovoltaic cell 24 that does not include the second (outermost) layer 26. In one embodiment, this space is approximately ½ inch in width. The second (outermost) layer 26 typically has a thickness of from 1 to 50, more typically of from 4 to 40, even more typically of from 3 to 30, and still more typically of from 4 to 15, and most typically of from 4 to 10, mils. The second (outermost) layer 26 may be tacky or non-tacky and may be a gel, gum, liquid, paste, resin, or solid. In one embodiment, the second (outermost) layer 26 is substantially free of entrapped air (bubbles). The terminology "substantially free" means that the second (outermost) layer 26 has no visible air bubbles. In the method of this invention, the second (outermost) layer 26 is formed from a liquid silicone composition, described in detail below, but may be cured or partially cured to be tacky or non-tacky and/or a gel, gum, liquid, paste, resin, or solid. In one embodiment, partial curing occurs when less than 90 percent of appropriate (i.e., expected) reactive moieties react. In another embodiment, curing occurs when at least 90 percent of appropriate (i.e., expected) reactive moieties react. The second (outermost) layer 26 may include or be free of one or more of polyethylene terephthalate, polyethylene naphthalate, polyvinyl fluoride, and ethylene vinyl acetate.

In one embodiment, the second (outermost) layer 26 includes a plurality of fibers 27, as shown in the Figures. In another embodiment, the second (outermost) layer 26 is free of the plurality of fibers 27, as is described in greater detail below. In FIGS. 6A/B, the detail for the fibers 27 has been merely omitted for the sake of clarity. The second (outermost) layer 26 typically includes at least two, and may include an unlimited number of, individual fibers 27. The terminology "fiber" includes continuous filaments and/or discrete lengths of materials that may be natural or synthetic. Natural fibers include, but are not limited to, those produced by plants, animals, and geological processes such as vegetable, wood, animal, and natural mineral fibers. Synthetic fibers include, but are not limited to, non-natural mineral fibers such as fiberglass, metallic fibers, carbon fibers, polymer fibers such as polyamide fibers, PET or PBT polyester fibers, phenol-formaldehyde (PF) fibers, polyvinyl alcohol fiber (PVOH) fibers, polyvinyl chloride fiber (PVC) fibers, polyolefins fibers, acrylic fibers, polyacrylonitrile fibers, aromatic polyamide (aramid) fibers, elastomeric fibers, polyurethane fibers, microfibers, and combinations thereof.

In one embodiment, the plurality of fibers 27 has a high modulus and high tensile strength. In another embodiment, the plurality of fibers 27 has a Young's modulus at 25° C. of at least 3 GPa. For example, the plurality of fibers 27 may have a Young's modulus at 25° C. of from 3 to 1,000 GPa, alternatively from 3 to 200 GPa, alternatively from 10 to 100 GPa. Moreover, the plurality of fibers 27 may have a tensile strength at 25° C. of at least 50 MPa. For example, the plurality of fibers 27 may have a tensile strength at 25° C. of from 50 to 10,000 MPa, alternatively from 50 to 1,000 MPa, alternatively from 50 to 500 MPa.

The individual fibers 27 are typically cylindrical in shape and may have a diameter of from 1 to 100 μm, alternatively from 1 to 20 μm, and alternatively form 1 to 10 μm. The plurality of fibers 27 may be heat-treated prior to use to remove organic contaminants. For example, the plurality of fibers 27 may be heated in air at an elevated temperature, for example, 575° C., for a suitable period of time, for example 2 h.

In one embodiment, the plurality of fibers 27 is further defined as a mat or roving. In another embodiment, the plurality of fibers 27 is further defined as a textile. The textile may be woven or non-woven or may include both woven and non-woven segments. In one embodiment, the textile is woven and is selected from the group of fiberglass, polyester, polyethylene, polypropylene, nylon, and combinations thereof. In another embodiment, the textile is non-woven and is selected from the group of fiberglass, polyester, polyethylene, polypropylene, nylon, and combinations thereof. In a further embodiment, the textile is non-woven fiberglass and is commercially available from Crane Nonwovens of Dalton, Mass. Alternatively, the textile may be non-woven polyester commercially available from Crane Nonwovens. Further, the textile may be non-woven and include polypropylene or polyethylene terephthalate. Of course, it is to be understood that the textile is not limited to aforementioned types of woven and non-woven textiles and may include any woven or non-woven textile known in the art. In one embodiment, the second (outermost) layer 26 includes more than one textile, e.g. two, three, or more individual textiles.

As is known in the art, woven textiles are typically cloths that are formed by weaving and that stretch in bias directions. As is also known in the art, non-woven textiles are neither woven nor knit and are typically manufactured by putting individual fibers 27 together in the form of a sheet or web, and then binding them either mechanically, with an adhesive, or thermally by melting a binder onto the textile. Non-woven textiles may include staple non-woven textiles and spunlaid non-woven textiles. Staple non-woven textiles are typically made by spinning fibers that are spread in a uniform web and then bonded by using either resin or heat. Spunlaid non-woven textiles are typically made in one continuous process by spinning fibers directly disposed into a web. The spunlaid process can be combined with a meltblowing process to form a SMS (spun-melt-spun) non-woven textile.

Non-woven textiles may also include films and fibrillates and can be formed using serration or vacuum-forming to form patterned holes. Fiberglass non-woven textiles typically are one of two types including wet laid mats having wet-chopped, denier fibers having 6 to 20 micrometer diameters or flame attenuated mats having discontinuous denier fibers having 0.1 to 6 micrometer diameters.

As first introduced above, the plurality of fibers 27 is at least partially coated with a silicone composition. In various embodiments, at least 50, 75, or 95 percent of a total surface area of the plurality of fibers 27 is coated with the silicone composition. In another embodiment, approximately 100 percent of a total surface area of the plurality of fibers 27 is coated with the silicone composition. FIG. 5 illustrates that at least 50 percent of a total surface area of the plurality of fibers 27 may be coated with the silicone composition.

The terminology "coated" refers to covering at least part of the surface area of the plurality of fibers 27. Typically, the silicone composition exudes through portions of the plurality of fibers 27 (e.g. the textile) such as pores. In one embodiment, as set forth in FIG. 5, the plurality of fibers 27 is further defined as a textile and defines voids through which the silicone composition may exude. In an alternative embodiment, the plurality of fibers 27 is further defined as being impregnated with the silicone composition. The silicone composition may impregnate some or all of the plurality of fibers 27. That is, in this embodiment, the silicone composition coats an exterior (surface area) of the plurality of fibers 27 and is also disposed throughout some or all of the voids defined by the plurality of fibers 27. In other words, in this embodiment, the silicone composition may exude through some voids and not through others. In a further embodiment, the plurality of fibers 27 is saturated with the silicone composition. In another embodiment, the plurality of fibers 27 is not saturated with the silicone composition. It is also contemplated that the silicone composition may encapsulate the plurality of fibers 27 in whole or in part. The silicone composition may also encapsulate the photovoltaic cell 24 in whole or in part. The surface area of the plurality of fibers 27 may be partially coated using any method known in the art including, but not limited to, spraying, dipping, rolling, brushing, and combinations thereof. In one embodiment, the plurality of fibers 27 is placed into the silicone composition. The silicone composition typically coats at least a part of the total surface area of the plurality of fibers 27 in a thickness 1 to 50, more typically of from 3 to 30, and most typically of from 4 to 15, mils. Of course, the invention is not limited to these thicknesses.

Referring back, the silicone composition may be any known in the art and may include, but is not limited to, silanes, siloxanes, silazanes, silylenes, silyl radicals or ions, elemental silicon, silenes, silanols, polymers thereof, and combinations thereof. In addition, the silicone composition may be cured, partially cured, or completely cured by any mechanism known in the art including, but not limited to, free radical reactions, hydrosilylation reactions, condensation or addition reactions, heat curing, UV curing, and combinations thereof. Typically, the silicone composition of this invention is further defined as hydrosilylation-curable. Thus, hydrosilylation cure silicone chemistry is focused on below. However, the invention is not limited to hydrosilylation cure silicone chemistry, as introduced above.

In one embodiment, the silicone composition includes an organosilicon compound, an organohydrogensilicon compound, and a hydrosilylation catalyst. The organosilicon compound typically has at least one unsaturated moiety per molecule and may include a single organosilicon compound, two organosilicon compounds, or a plurality of organosilicon compounds. In various embodiments, the organosilicon compound has two, three, or multiple unsaturated moieties per molecule. In one embodiment, the organosilicon compound includes an alkenyl siloxane wherein an alkenyl group is pending from a siloxane group. The alkenyl group may be located at any interval and/or location in the siloxane group. That is, the alkenyl group may be terminal, pendant, or if the organosilicon compound includes more than one alkenyl group, the alkenyl groups may be both terminal and pendant. In one embodiment, the organosilicon compound is terminated with a siloxane that is itself alkenyl terminated. In another embodiment, the alkenyl siloxane is an alkenyl-terminated siloxane, i.e., the alkenyl group may be located at one or more terminal ends of the siloxane group. Alternatively, the alkenyl siloxane may be an alkenyl-pendent siloxane. The alkenyl-pendent siloxane typically includes at least one alkenyl group pending from any location along the siloxane group other than at one of the terminal ends of the siloxane group. The alkenyl-terminated or -pendant siloxane may be linear, branched, cyclic, or any combination thereof. The alkenyl group may include a carbon chain pending directly from at least one terminal end of the siloxane group or from a location along the siloxane group that is not a terminal end, and may have from two to twelve carbon atoms with at least one C=C bond. Preferably, the C=C bond is located at an end of the carbon chain, such as vinyl, 5-hexenyl, 7-octenyl, etc. In addition, the alkenyl group is not limited to one C=C bond and may include more than one C=C bond. Further, the alkenyl-terminated siloxane may include more than one alkenyl group. The more than one alkenyl group may be bonded to the same atom within the siloxane or, alternatively, may be bonded to different atoms in the siloxane. It is also contemplated that the at least one unsaturated moiety may include alkynyl groups which may be substituted for alkenyl groups, where chemically appropriate.

In various embodiments, the organosilicon compound has silicon-bonded alkenyl groups and typically is a copolymer including $R^2SiO_{3/2}$ units, i.e., T units, and/or $SiO_{4/2}$ units, i.e., Q units, in combination with $R^1R^2_2SiO_{1/2}$ units, i.e., M units, and/or $R^2_2SiO_{2/2}$ units, i.e., D units, wherein $R^1$ is a $C_1$ to $C_{10}$ hydrocarbyl group or a $C_1$ to $C_{10}$ halogen-substituted hydrocarbyl group, both free of aliphatic unsaturation, and $R^2$ is an alkenyl group. For example, the organosilicon compound can be further defined as a DT resin, an MT resin, an MDT resin, a DTQ resin, an MTQ resin, an MDTQ resin, a DQ resin, an MQ resin, a DTQ resin, an MTQ resin, or an MDQ resin, so long as it has at least one unsaturated moiety per molecule.

The $C_1$ to $C_{10}$ hydrocarbyl group and $C_1$ to $C_{10}$ halogen-substituted hydrocarbyl group represented by $R^1$ more typically have from 1 to 6 carbon atoms. Acyclic hydrocarbyl and halogen-substituted hydrocarbyl groups containing at least 3 carbon atoms can have a branched or unbranched structure. Examples of hydrocarbyl groups represented by $R^1$ include, but are not limited to, alkyl groups, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl, and decyl, cycloalkyl groups, such as cyclopentyl, cyclohexyl, and methylcyclohexyl, aryl groups, such as phenyl and naphthyl, alkaryl groups, such as tolyl and xylyl, and aralkyl groups, such as benzyl and phenethyl. Examples of halogen-substituted hydrocarbyl groups represented by $R^1$ include, but are not limited to, 3,3,3-trifluoropropyl, 3-chloropropyl, chlorophenyl, dichlorophenyl, 2,2,2-trifluoroethyl, 2,2,3,3-tetrafluoropropyl, and 2,2,3,3,4,4,5,5-octafluoropentyl.

The alkenyl groups represented by $R^2$, which may be the same or different within the organosilicon compound, typically have from 2 to 10 carbon atoms, alternatively from 2 to 6 carbon atoms, and are exemplified by, but are not limited to, vinyl, allyl, methallyl, butenyl, hexenyl, octenyl, decenyl, cyclohexenyl, styryl, and the like.

In one embodiment, the organosilicon compound is further defined as having the formula:

$$(R^1R^2_2SiO_{1/2})_w(R^2_2SiO_{2/2})_x(R^2SiO_{3/2})_y(SiO_{4/2})_z \qquad (I)$$

wherein $R^1$ and $R^2$ are as described and exemplified above and w, x, y, and z are mole fractions. Typically, the organosilicon compound represented by formula (I) has an average of at least two silicon-bonded alkenyl groups per molecule. More specifically, the subscript w typically has a value of from 0 to 0.9, alternatively from 0.02 to 0.75, alternatively from 0.05 to 0.3. The subscript x typically has a value of from 0 to 0.9, alternatively from 0 to 0.45, alternatively from 0 to 0.25. The subscript y typically has a value of from 0 to 0.99, alternatively from 0.25 to 0.8, alternatively from 0.5 to 0.8. The subscript z typically has a value of from 0 to 0.85, alternatively from 0 to 0.25, alternatively from 0 to 0.15. Also, the ratio y+z/(w+x+y+z) is typically from 0.1 to 0.99, alternatively from 0.5 to 0.95, alternatively from 0.65 to 0.9. Further, the ratio w+x/(w+x+y+z) is typically from 0.01 to 0.90, alternatively from 0.05 to 0.5, alternatively from 0.1 to 0.35.

Additional non-limiting examples of suitable organosilicon compounds represented by formula (I) set forth above include, but are not limited to, resins having the following formulae:

$(Vi_2MeSiO_{1/2})_{0.25}(PhSiO_{3/2})_{0.75}, (ViMe_2SiO_{1/2})_{0.25}(PhSiO_{3/2})_{0.75},$ $(ViMe_2SiO_{1/2})_{0.25}(MeSiO_{3/2})_{0.25}(PhSiO_{3/2})_{0.50},$ $(ViMe_2SiO_{1/2})_{0.15}(PhSiO_{3/2})_{0.75}(SiO_{4/2})_{0.1},$ and $(Vi_2MeSiO_{1/2})_{0.15}(ViMe_2SiO_{1/2})_{0.1}(PhSiO_{3/2})_{0.75},$ wherein Me is methyl, Vi is vinyl, Ph is phenyl, and the numerical subscripts outside the parenthesis denote mole fractions corresponding to either w, x, y, or z as described above for formula (I) set forth above. The sequence of units in the preceding formulae is not to be viewed in any way as limiting to the scope of the invention.

The organosilicon compound represented by formula (I) typically has a number-average molecular weight ($M_n$) of from 500 to 50,000, alternatively from 500 to 10,000, alternatively 1,000 to 3,000, g/mol, where the molecular weight is determined by gel permeation chromatography employing a low angle laser light scattering detector, or a refractive index detector and silicone resin (MQ) standards. The viscosity of the organosilicon compound represented by formula (I) at 25° C. may be from 0.01 to 100,000 Pa·s, alternatively from 0.1 to 10,000 Pa·s, alternatively from 1 to 100 Pa·s.

The organosilicon compound represented by formula (I) typically includes less than 10% (w/w), alternatively less than 5% (w/w), alternatively less than 2% (w/w), of silicon-bonded hydroxy groups, as determined by $^{29}Si$ NMR.

In one embodiment, the organosilicon compound is further defined as a dialkylvinylsiloxy-terminated dialkyl siloxane. In another embodiment, the organosilicon compound is further defined as a dialkylalkenylsiloxy-terminated dialkylsiloxane. Non-limiting examples of the organosilicon compound include dimethylvinylsiloxy-terminated dimethylsiloxane, dimethylvinylsiloxy-terminated dimethyl siloxane, methylvinyl siloxane, and combinations thereof. In yet another embodiment, the organo silicon compound is further defined as dimethylvinylsiloxy-pendent dimethylsiloxane. Alternatively, the organosilicon compound may be further defined as an alkenyldialkylsilyl end-blocked polydialkylsiloxane. In one embodiment, the organosilicon compound is further defined as vinyldimethylsilyl end-blocked polydimethylsiloxane.

Referring back, the silicone composition also typically includes the organohydrogensilicon compound having at least one silicon-bonded hydrogen atom per molecule. The organohydrogensilicon compound may include a single organohydrogensilicon compound, two organohydrogensilicon compounds, or a plurality of organohydrogensilicon compounds. The organohydrogensilicon compound typically has an average of at least two silicon-bonded hydrogen atoms per molecule, and alternatively at least three silicon-bonded hydrogen atoms per molecule. The organohydrogensilicon compound may be further defined as an organohydrogensilane, an organohydrogensiloxane, or a combination thereof. The structure of the organohydrogensilicon compound can be linear, branched, cyclic, or resinous. In acyclic polysilanes and polysiloxanes, the silicon-bonded hydrogen atoms can be located at terminal, pendant, or at both terminal and pendant positions. Cyclosilanes and cyclosiloxanes typically have from 3 to 12 silicon atoms, alternatively from 3 to 10 silicon atoms, alternatively from 3 to 4 silicon atoms.

The organohydrogensilane can be a monosilane, disilane, trisilane, or polysilane. Some non-limiting examples of suitable organohydrogensilanes include diphenylsilane, 2-chloroethylsilane, bis[(p-dimethylsilyl)phenyl]ether, 1,4-dimethyldisilylethane, 1,3,5-tris(dimethylsilyl)benzene, 1,3,5-trimethyl-1,3,5-trisilane, poly(methylsilylene)phenylene, and poly(methylsilylene)methylene.

The organohydrogensilane can also have the formula:

$$HR^1_2Si-R^3-SiR^1_2H \quad (II)$$

wherein $R^1$ is as defined and exemplified above and $R^3$ is a hydrocarbylene group free of aliphatic unsaturation having a formula selected from the following structures:

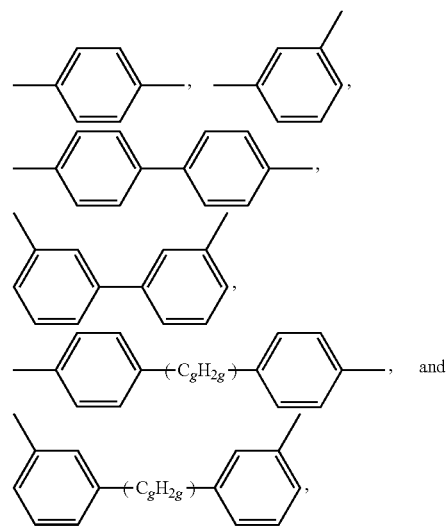

wherein g is from 1 to 6.

Specific examples of organohydrogensilanes of the above formula (II) wherein $R^1$ and $R^3$ are as described and exemplified above include, but are not limited to, organohydrogensilanes having a formula selected from the following structures:

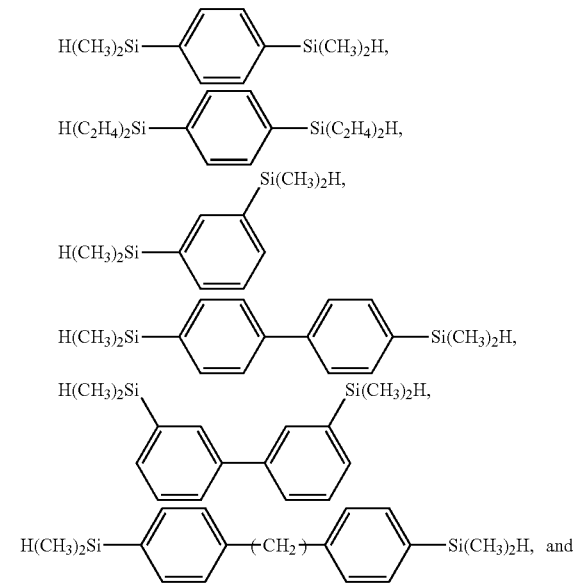

-continued

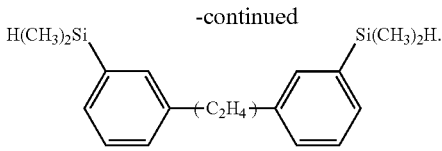

The organohydrogensiloxane can be a disiloxane, trisiloxane, or polysiloxane. Specific non-limiting examples of suitable organohydrogensiloxanes include 1,1,3,3-tetramethyldisiloxane, 1,1,3,3-tetraphenyldisiloxane, phenyltris(dimethylsiloxy)silane, 1,3,5-trimethylcyclotrisiloxane, a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin including $HMe_2SiO_{1/2}$ units, $Me_3SiO_{1/2}$ units, and $SiO_{4/2}$ units, wherein Me is methyl.

The organohydrogensiloxane may be further defined as an organohydrogenpolysiloxane resin, so long as the resin includes at least one silicon-bonded hydrogen atom per molecule. The organohydrogenpolysiloxane resin may be a copolymer including $R^4SiO_{3/2}$ units, i.e., T units, and/or $SiO_{4/2}$ units, i.e., Q units, in combination with $R^1R^4_2SiO_{1/2}$ units, i.e., M units, and/or $R^4_2SiO_{2/2}$ units, i.e., D units, wherein $R^1$ is as described and exemplified above. For example, the organohydrogenpolysiloxane resin can be a DT resin, an MT resin, an MDT resin, a DTQ resin, an MTQ resin, an MDTQ resin, a DQ resin, an MQ resin, a DTQ resin, an MTQ resin, or an MDQ resin.

The group represented by $R^4$ is typically an organosilylalkyl group having at least one silicon-bonded hydrogen atom. Examples of organosilylalkyl groups represented by $R^4$ include, but are not limited to, groups having a formula selected from the following structures:

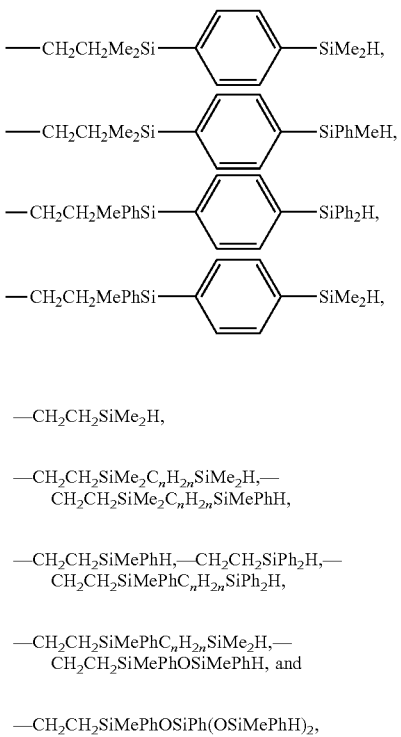

—$CH_2CH_2SiMe_2H$,

—$CH_2CH_2SiMe_2C_nH_{2n}SiMe_2H$,—
 $CH_2CH_2SiMe_2C_nH_{2n}SiMePhH$,

—$CH_2CH_2SiMePhH$,—$CH_2CH_2SiPh_2H$,—
 $CH_2CH_2SiMePhC_nH_{2n}SiPh_2H$,

—$CH_2CH_2SiMePhC_nH_{2n}SiMe_2H$,—
 $CH_2CH_2SiMePhOSiMePhH$, and

—$CH_2CH_2SiMePhOSiPh(OSiMePhH)_2$, wherein Me is methyl, Ph is phenyl, and the subscript n has a value of from 2 to 10.

In various embodiments, the organohydrogenpolysiloxane resin has the formula:

$(R^1R^4_2SiO_{1/2})_w(R^4_2SiO_{2/2})_x(R^4SiO_{3/2})_y(SiO_{4/2})_z$ wherein $R^1$, $R^4$, w, x, y, and z are each as defined and exemplified above. Specific examples of organohydrogenpolysiloxane resins represented by the above formula include, but are not limited to, resins having the following formulae:

$((HMe_2SiC_6H_4SiMe_2CH_2CH_2)_2MeSiO_{1/2})_{0.12}(PhSiO_{3/2})_{0.88}$, $((HMe_2SiC_6H_4SiMe_2CH_2CH_2)_2MeSiO_{1/2})_{0.17}(PhSiO_{3/2})_{0.83}$, $((HMe_2SiC_6H_4SiMe_2CH_2CH_2)_2MeSiO_{1/2})_{0.17}(MeSiO_{3/2})_{0.17}(PhSiO_{3/2})_{0.66}$, $((HMe_2SiC_6H_4SiMe_2CH_2CH_2)_2MeSiO_{1/2})_{0.15}(PhSiO_{3/2})_{0.75}(SiO_{4/2})_{0.10}$, and $((HMe_2SiC_6H_4SiMe_2CH_2CH_2)_2MeSiO_{1/2})_{0.08}((HMe_2SiC_6H_4SiMe_2CH_2CH_2)Me_2SiO_{1/2})_{0.06}(PhSiO_{3/2})_{0.86}$, wherein Me is methyl, Ph is phenyl, $C_6H_4$ denotes a para-phenylene group, and the numerical subscripts outside the parenthesis denote mole fractions. The sequence of units in the preceding formulae is not to be viewed in any way as limiting to the scope of the invention.

The organohydrogensilicon compound may have a molecular weight less than 1,000, alternatively less than 750, alternatively less than 500, g/mol. In addition, the organohydrogensilicon compound can be a single organohydrogensilicon compound or a mixture comprising two or more different organohydrogensilicon compound, each as described above. For example, the organohydrogensilicon compound can be a single organohydrogensilane, a mixture of two different organohydrogensilanes, a single organohydrogensiloxane, a mixture of two different organohydrogensiloxanes, or a mixture of an organohydrogensilane and an organohydrogensiloxane, so long as the organohydrogensilicon compound has at least one silicon-bonded hydrogen atom per molecule. In one embodiment, the organohydrogensilicon compound is further defined as a dimethylhydrogensilyl terminated polydimethylsiloxane. The organohydrogensilicon compound may also be further defined as a trialkylsilyl terminated polydialkylsiloxane-alkylhydrogensiloxane co-polymer. In one embodiment, the organohydrogensilicon compound is further defined as a trimethylsilyl terminated polydimethylsiloxane-methylhydrogensiloxane co-polymer. In one embodiment, the organohydrogensilicon compound is further defined as a mixture of a dialkylhydrogensilyl terminated polydialkylsiloxane and a trialkylsilyl terminated polydialkylsiloxane-alkylhydrogensiloxane co-polymer. The dialkylhydrogensilyl terminated polydialkylsiloxane of this embodiment may be further defined as dimethylhydrogensilyl terminated polydimethylsiloxane and the trialkylsilyl terminated polydialkylsiloxane-alkylhydrogensiloxane co-polymer of this embodiment may be further defined as a trimethylsilyl terminated polydimethylsiloxane-methylhydrogensiloxane co-polymer.

Referring back, the silicone composition also typically includes a hydrosilylation catalyst used to accelerate a hydrosilylation reaction between the organo silicon compound and the organohydrogensilicon compound. The hydrosilylation catalyst can be any of the well-known hydrosilylation catalysts comprising a platinum group metal (i.e., platinum, rhodium, ruthenium, palladium, osmium and iridium) or a compound containing a platinum group metal.

Typically, the platinum group metal is platinum, based on its high activity in hydrosilylation reactions.

Specific hydrosilylation catalysts suitable for use include the complexes of chloroplatinic acid and certain vinyl-containing organosiloxanes disclosed by Willing in U.S. Pat. No. 3,419,593, the portions of which address hydrosilylation catalysts are hereby incorporated by reference. A catalyst of this type is the reaction product of chloroplatinic acid and 1,3-diethenyl-1,1,3,3-tetramethyldisiloxane.

The hydrosilylation catalyst can also be a supported hydrosilylation catalyst comprising a solid support having a platinum group metal on the surface thereof. A supported catalyst can be conveniently separated from the silicone composition by filtration. Examples of supported catalysts include, but are not limited to, platinum on carbon, palladium on carbon, ruthenium on carbon, rhodium on carbon, platinum on silica, palladium on silica, platinum on alumina, palladium on alumina, and ruthenium on alumina.

It is contemplated that the hydrosilylation catalyst may be a microencapsulated platinum group metal-containing catalyst comprising a platinum group metal encapsulated in a thermoplastic resin. Silicone compositions including microencapsulated hydrosilylation catalysts are stable for extended periods of time, typically several months or longer, under ambient conditions, yet cure relatively rapidly at temperatures above the melting or softening point of the thermoplastic resin(s). Microencapsulated hydrosilylation catalysts and methods of preparing them are well known in the art, as exemplified in U.S. Pat. No. 4,766,176 and the references cited therein, and U.S. Pat. No. 5,017,654. The hydrosilylation catalyst of this invention can be a single catalyst or a mixture comprising two or more different catalysts that differ in at least one property, such as structure, form, platinum group metal, complexing ligand, and thermoplastic resin.

In one embodiment, the hydrosilylation catalyst includes at least one photoactivated hydrosilylation catalyst. The photoactivated hydrosilylation catalyst can be any hydrosilylation catalyst capable of catalyzing the hydrosilylation of the organosilicon compound and the organohydrogensilicon compound upon exposure to radiation having a wavelength of from 150 to 800 nm. The photoactivated hydrosilylation catalyst can be any of the well-known hydrosilylation catalysts comprising a platinum group metal or a compound containing a platinum group metal. The platinum group metals include platinum, rhodium, ruthenium, palladium, osmium, and iridium. Typically, the platinum group metal is platinum, based on its high activity in hydrosilylation reactions.

Specific examples of photoactivated hydrosilylation catalysts suitable for purposes of the present invention include, but are not limited to, platinum(II) β-diketonate complexes such as platinum (II) bis(2,4-pentanedionate), platinum (II) bis(2,4-hexanedionate), platinum(II) bis(2,4-heptanedionate), platinum(II) bis(1-phenyl-1,3-butanedionate, platinum (II) bis(1,3-diphenyl-1,3-propanedionate), platinum(II) bis(1,1,1,5,5,5-hexafluoro-2,4-pentanedioate); (η-cyclopentadienyl)trialkylplatinum complexes, such as (Cp)trimethylplatinum, (Cp)ethyldimethylplatinum, (Cp)triethylplatinum, (chloro-Cp)trimethylplatinum, and (trimethylsilyl-Cp)trimethylplatinum, where Cp represents cyclopentadienyl; triazene oxide-transition metal complexes, such as $Pt[C_6H_5NNNOCH_3]_4$, $Pt[p-CN-C_6H_4NNNOC_6H_{11}]_4$, $Pt[p-H_3COC_6H_4NNNOC_6H_{11}]_4$, $Pt[p-CH_3(CH_2)_x-C_6H_4NNNOCH_3]_4$, 1,5-cyclooctadiene. $Pt[p-CN-C_6H_4NNNOC_6H_{11}]_2$, 1,5-cyclooctadiene. $Pt[p-CH_3O-C_6H_4NNNOCH_3]_2$, $[(C_6H_5)_3]_3Rh[p-CN-C_6H_4NNNOC_6H_{11}]$, and $Pd[p-CH_3(CH_2)_x-C_6H_4NNNOCH_3]_2$, where x is 1, 3, 5, 11, or 17; (η-diolefin)(σ-aryl)platinum complexes, such as ($\eta^4$-1,5-cyclooctadienyl)diphenylplatinum, $\eta^4$-1,3,5,7-cyclooctatetraenyl)diphenylplatinum, ($\eta^4$-2,5-norboradienyl)diphenylplatinum, ($\eta^4$-1,5-cyclooctadienyl)bis-(4-dimethylaminophenyl)platinum, ($\eta^4$-1,5-cyclooctadienyl)bis-(4-acetylphenyl)platinum, and ($\eta^4$-1,5-cyclooctadienyl)bis-(4-trifluoromethylphenyl)platinum.

Typically, the photoactivated hydrosilylation catalyst is a Pt(II) β-diketonate complex and more typically the catalyst is platinum(II) bis(2,4-pentanedioate). The hydrosilylation catalyst can be a single photoactivated hydrosilylation catalyst or a mixture comprising two or more different photoactivated hydrosilylation catalysts.

Methods of preparing photoactivated hydrosilylation catalysts are well known in the art. For example, methods of preparing platinum(II) β-diketonates are reported by Guo et al. (Chemistry of Materials, 1998, 10, 531-536). Methods of preparing (η-cyclopentadienyl)-trialkylplatinum complexes are disclosed in U.S. Pat. No. 4,510,094. Methods of preparing triazene oxide-transition metal complexes are disclosed in U.S. Pat. No. 5,496,961. Methods of preparing (η-diolefin)(σ-aryl)platinum complexes are taught in U.S. Pat. No. 4,530,879.

The concentration of hydrosilylation catalyst is sufficient to catalyze the hydrosilylation of the organosilicon compound and the organohydrogensilicon compound. Typically, the concentration of the hydrosilylation catalyst is sufficient to provide from 0.1 to 1000 ppm of a platinum group metal, alternatively from 1 to 500 ppm of a platinum group metal, alternatively from 3 to 150 ppm of a platinum group metal, and alternatively from 1 to 25 ppm of a platinum group metal, based on the combined weight of the organosilicon compound and the organohydrogensilicon compound. One particularly suitable catalyst includes 1,3-diethenyl-1,1,3,3-tetramethyldisiloxane platinum complexes. The catalysts may be included in amounts as determined by one of skill in the art. In one embodiment, the catalyst is included in the silicone composition in an amount of from 0.05 to 0.30 parts by weight per 100 parts by weight of the silicone composition.

The silicone composition also typically includes a ratio of silicon-bonded hydrogen atoms per molecule of the organohydrogensilicon compound to unsaturated moieties per molecule of the organosilicon compound of from 0.05 to 100. In alternative embodiments, the ratio is from 0.1 to 100, 0.05 to 20, 0.05 to 0.7, 0.1 to 0.8, 0.1 to 0.6, 0.5 to 2, 1.5 to 5, 1.75 to 3, 2 to 2.5, and from 0.95 to 1.05. In various embodiments, there is a stoichiometric excess of silicon bonded hydrogen atoms to unsaturated moieties which may enhance adhesion between the first outermost layer 22 and the second (outermost) layer 26 or a tie layer 30, described in greater detail below. Of course, it is to be understood that the above referenced ratios do not limit this invention so long as the ratio is between 0.05 to 100.

As first introduced above, the second (outermost) layer 26 may be free of the plurality of fibers 27 or may include the plurality of fibers 27. In one embodiment, the silicone composition used to form the second (outermost) layer 26 is further defined as a hydrosilylation-curable silicone composition which may coat the plurality of fibers 27, as described above. Typically, this hydrosilylation-curable silicone composition is liquid, i.e., flows at room temperature. The hydrosilylation-curable silicone composition may include a filler or be free of the filler. Conversely, the hydrosilylation-curable silicone composition may include both the plurality of fibers 27 and the filler.

The hydrosilylation-curable silicone composition includes a linear organosilicon compound having two terminal unsaturated moieties per molecule, a branched organosilicon compound having two terminal unsaturated moieties per molecule and at least one pendant unsaturated moiety per molecule, and an organohydrogensilicon compound having at least one silicon-bonded hydrogen atom per molecule. In one embodiment, the organohydrogensilicon compound has at least two silicon-bonded hydrogen atoms per molecule. In another embodiment, the organohydrogensilicon compound has at least three silicon-bonded hydrogen atoms per molecule.

The hydrosilylation-curable silicone composition also typically includes the filler, introduced above, and a hydrosilylation catalyst used to accelerate a hydrosilylation reaction between the linear organosilicon compound, the branched organosilicon compound, and the organohydrogensilicon compound. Various hydrosilylation catalysts that can be utilized in this embodiment are described above. In this embodiment, the linear organosilicon compound is present in an amount of from 80 to 95 parts by weight and the branched organosilicon compound is present in an amount of from 5 to 20 as parts by weight, per 100 parts by weight of a sum of the linear organosilicon compound and the branched organosilicon compound. In other embodiments, the linear organosilicon compound is present in an amount of from 85 to 95, from 86 to 94, from 88 to 90, from 90 to 95, or from 92 to 94, or of about 80, 86, 90, or 93, parts by weight, per 100 parts by weight of a sum of the linear organosilicon compound and the branched organosilicon compound. In still other embodiments, the branched organosilicon compound is present in an amount of from 5 to 15, from 7 to 10, from 7 to 14, from 10 to 20, or of about 7, 10, 14, or 20, parts by weight, per 100 parts by weight of a sum of the linear organosilicon compound and the branched organosilicon compound. It is to be understood that the linear and/or branched organosilicon compounds may each be independently utilized in any amount or range of amounts within those ranges described above.

Also, in the hydrosilylation-curable silicone composition, a ratio of silicon-bonded hydrogen atoms per molecule of the organohydrogensilicon compound to a sum of unsaturated moieties per molecule of the linear organosilicon compound and the branched organosilicon compound is from 1 to 1.7, typically from 1.1 to 1.6 or from 1.1 to 1.2. In various embodiments, the ratio is from 1.5 to 1.55.

The hydrosilylation-curable silicone composition may include a first portion and a second portion when used. The linear organosilicon compound, the branched organosilicon compound, and the organohydrogensilicon compound may be present in the first portion, the second portion, or in both the first and second portions. In one embodiment, the linear organosilicon compound, the branched organosilicon compound, and the organohydrogensilicon compound are not all present in one portion due to a potential to prematurely react. In another embodiment, the organosilicon compound, the branched organosilicon compound, and the organohydrogensilicon compound are all present in one portion but are not present with a hydrosilylation catalyst. In still another embodiment, the linear and branched organosilicon compounds are present in the first portion and the organohydrogensilicon compound and the hydrosilylation catalyst are present in the second portion. In still other embodiments, the linear organosilicon compound and/or the branched organosilicon compound are present in both the first and second portions while the hydrosilylation catalyst is present in the first portion and the organohydrogensilicon compound is present in the second portion. Typically, any cross-linker or chain extender is present in the second portion without the catalyst. In various embodiments, the first and second portions have varying viscosities of from 200 to 15,000 cps at 25° C. determined according to ASTM D4287. In other embodiments, the first and second portions have approximate viscosities as follows: 289, 289, 1449, 2000, 2064, 3440, 4950, 5344, 8,194, 11,212, 12,680, and 14,129, cps at 25° C. determined according to ASTM D4287.

The linear organosilicon compound may be any of the compounds described above or may be different so long as the linear organosilicon compound has two terminal unsaturated moieties per molecule. Typically, the linear organosilicon compound has exactly two terminal unsaturated moieties per molecule. The linear organosilicon compound does not have pendant unsaturated moieties. In various embodiments, the linear organosilicon compound is further defined as a vinyl end-blocked polydialkylsiloxane, e.g. a vinyl end-blocked polydimethylsiloxane that has two terminal vinyl groups. In other embodiments, the linear organosilicon compound has an average degree of polymerization (DP) of from 150 to 900, a weight average molecular weight of from 11,000 to 63,000, a viscosity of from 400 to 60,000 cps at 25° C. determined according to ASTM D4287, and a weight percent of vinyl groups of from 0.01 to 10. In still other embodiments, the linear organosilicon compound has the following physical properties ±1%, ±3%, ±5%, ±10%, ±15%, ±20%, or ±25%. It is also contemplated that the linear organosilicon compound may have other physical properties not set forth below.

| Various Embodiments | Average DP | Weight Avg. Mol. Wt. (g/mol) | Viscosity (cps at 25° C.) | Wt. % Vinyl Groups |
|---|---|---|---|---|
| Vinyl End-Blocked Polydimethylsiloxane | 297 | 22,000 | 2,100 | 0.21 |
| Vinyl End-Blocked Polydimethylsiloxane | 155 | 11,500 | 450 | 0.46 |
| Vinyl End-Blocked Polydimethylsiloxane | 837 | 62,000 | 55,000 | 0.088 |

It is also contemplated that the hydrosilylation-curable silicone composition may include more than one linear organosilicon compound that is described above. Additional linear organosilicon compounds that are contemplated for use in this invention are described in U.S. Pat. No. 5,574,073, which is expressly incorporated herein by reference.

The branched organosilicon compound may also be any of the compounds described above or may be different so long as the branched organosilicon compound has two terminal unsaturated moieties per molecule and at least one pendant unsaturated moiety per molecule. In various embodiments, the branched organosilicon compound is further defined as a vinyl end-blocked polydialkylsiloxane having at least one vinyl pendant group, e.g. a vinyl end-blocked polydimethylsiloxane having two terminal vinyl groups and at least one vinyl pendant group. In other embodiments, the branched organosilicon compound has an average degree of polymerization (DP) of from 100 to 800, a weight average molecular weight of from 8,000 to 60,000, a viscosity of from 200 to 30,000 cps at 25° C. determined according to ASTM D4287, and a weight percent of vinyl groups of from 0.1 to 10. In one embodiment, the branched organosilicon compound has an average degree of polymerization (DP) of about 620, a weight average molecular weight of about 46,000 g/mol, a viscosity of about 15,000 cps at 25° C. determined according to ASTM D4287, and a weight percent of vinyl groups of about 7.7. It is also contemplated that the hydrosilylation-curable silicone composition may include more than one branched organosilicon compound that is described above. Additional branched organosilicon compound that are contemplated for use in this invention are described in U.S. Pat. No. 5,574,073, which is expressly incorporated herein by reference.

It is to be understood that the terminology "silicone composition" and "hydrosilylation-curable silicone composition," when used herein, are interchangeable so long as the hydrosilylation-curable silicone composition remains as described above. Said differently, this terminology is interchangeable so long as the hydrosilylation-curable silicone composition includes a linear organo silicon compound having two terminal unsaturated moieties per molecule, a branched organosilicon compound having two terminal unsaturated moieties per molecule and at least one pendant unsaturated moiety per molecule, and an organohydrogensilicon compound having at least one silicon-bonded hydrogen atom per molecule.

The silicone composition may also include a silicone rubber having a formula selected from the group of (a) $R^1R^2_2SiO(R^2_2SiO)_aSiR^2_2R^1$ and (b) $R^5R^1_2SiO(R^1R^5SiO)_bSiR^1_2R^5$; wherein $R^1$ and $R^2$ are as defined and exemplified above, $R^5$ is $R^1$ or —H, subscripts a and b each have a value of from 1 to 4, alternatively from 2 to 4, alternatively from 2 to 3, and w, x, y, and z are also as defined and exemplified above. Specific examples of silicone rubbers suitable for use as silicone rubber (a) include, but are not limited to, silicone rubbers having the following formulae:

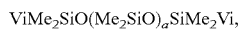
ViMe$_2$SiO(Me$_2$SiO)$_a$SiMe$_2$Vi,

ViMe$_2$SiO(Ph$_2$SiO)$_a$SiMe$_2$Vi, and

ViMe$_2$SiO(PhMeSiO)$_a$SiMe$_2$Vi wherein Me is methyl, Ph is phenyl, Vi is vinyl, and the subscript has a value of from 1 to 4. Silicone rubber (a) can be a single silicone rubber or a mixture comprising two or more different silicone rubbers that each satisfy the formula for (a).

Specific examples of silicone rubbers suitable for use as silicone rubber (b) include, but are not limited to, silicone rubbers having the following formulae:

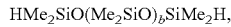
HMe$_2$SiO(Me$_2$SiO)$_b$SiMe$_2$H,

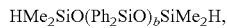
HMe$_2$SiO(Ph$_2$SiO)$_b$SiMe$_2$H,

HMe$_2$SiO(PhMeSiO)$_b$SiMe$_2$H, and

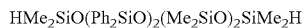
HMe$_2$SiO(Ph$_2$SiO)$_2$(Me$_2$SiO)$_2$SiMe$_2$H wherein Me is methyl, Ph is phenyl, and the subscript h has a value of from 1 to 4. Component (b) can be a single silicone rubber or a mixture comprising two or more different silicone rubbers that each satisfy the formula for (b).

In other embodiments of the present invention, the silicone composition includes a rubber-modified silicone resin prepared by reacting the organosilicon compound and at least one silicone rubber (b) selected from rubbers having the following formulae:

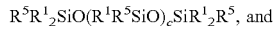
$R^5R^1_2SiO(R^1R^5SiO)_cSiR^1_2R^5$, and

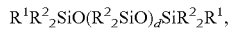
$R^1R^2_2SiO(R^2_2SiO)_dSiR^2_2R^1$, wherein $R^1$ and $R^5$ are as defined and exemplified above and c and d each have a value of from 4 to 1000, alternatively from 10 to 500, alternatively from 10 to 50, in the presence of the hydrosilylation catalyst and, optionally, an organic solvent, provided that the reaction product of the organosilicon compound and the silicone rubber (b) has at least one unsaturated moiety per molecule.

In one embodiment, the silicone composition includes from 45 to 90 parts by weight of a dimethylvinylsiloxy-terminated dimethylsiloxane, from 0.5 to 2 parts by weight of an alkoxysilane, 0.5 to 2 parts by weight of a methacryloxypropyltrimethoxysilane, from 0.01 to 0.2 parts by weight of tetramethyltetravinycyclotetrasiloxane, from 2 to 10 parts by weight of a hydrogen terminated dimethylsiloxane, from 0.2 to 1 parts by weight of dimethylmethylhydrogensiloxane, and from 0.01 to 0.1 parts by weight of 1,3-diethenyl-1,1,3,3-tetramethyldisiloxane platinum complexes. In another embodiment, the silicone composition includes from 45 to 90 parts by weight of a dimethylvinylsiloxy-terminated dimethylsiloxanes, from 0.5 to 2 parts by weight of an alkoxysilane, 0.5 to 2 parts by weight of a methacryloxypropyltrimethoxysilane, from 0.01 to 0.2 parts by weight of tetramethyltetravinycyclotetrasiloxane, from 2 to 10 parts by weight of a hydrogen terminated dimethylsiloxane, from 0.2 to 1 parts by weight of dimethylmethylhydrogensiloxane, from 20 to 60 parts by weight of quartz, and from 0.01 to 0.1 parts by weight of 1,3-diethenyl-1,1,3,3-tetramethyldisiloxane platinum complexes.

The silicone composition may also include a solvent, e.g. an organic solvent. The organic solvent can be any aprotic or dipolar aprotic organic solvent that does not react with, and is miscible with, the organosilicon compound and the organohydrogensilicon compound. Non-limiting examples of suitable organic solvents include saturated aliphatic hydrocarbons such as n-pentane, hexane, n-heptane, isooctane and dodecane, cycloaliphatic hydrocarbons such as cyclopentane and cyclohexane, aromatic hydrocarbons such as benzene, toluene, xylene and mesitylene, cyclic ethers such as tetrahydrofuran (THF) and dioxane, ketones such as methyl isobutyl ketone (MIBK), halogenated alkanes such as trichloroethane, halogenated aromatic hydrocarbons such as bromobenzene and chlorobenzene, and combinations thereof. The organic solvent may be a single organic solvent or a mixture comprising two or more different organic solvents, each as described above. The concentration of the organic solvent in the silicone composition may be from 0 to 99% (w/w), alternatively from 30 to 80% (w/w), and alternatively from 45 to 60% (w/w), based on the total weight of the silicone composition.

The silicone composition may also include the filler, as first introduced above. The filler may be used to dissipate heat from the module 20. The filler may be any known in the art and may include a single filler or a combination of fillers. The filler may be thermally and/or electrically conductive or insulating. The filler may be further defined as a reinforcing filler, an extending filler, a thixotropic filler, a pigment, or a combination thereof. The filler may include one or more finely divided reinforcing fillers such as high surface area fumed and precipitated silicas, zinc oxide, aluminum, aluminum powder, aluminum tri-hydrate, silver, calcium carbonate, and/or additional extending fillers such as quartz, diatomaceous earths, barium sulfate, iron oxide, titanium dioxide and carbon black, talc, wollastonite, aluminite, calcium sulfate (anhydrite), gypsum, calcium sulfate, magnesium carbonate, clays such as kaolin, aluminum trihydroxide, magnesium hydroxide (brucite), graphite, copper carbonate such as malachite, nickel carbonate such as zarachite, barium carbonate such as witherite, strontium carbonate such as strontianite, aluminum oxide, silicates including, but not limited to, olivine groups, garnet groups, aluminosilicates, ring silicates, chain silicates, and sheet silicates, and combinations thereof. The olivine groups may include, but are not limited to, forsterite, $Mg_2SiO_4$, and combinations thereof. Non-limiting examples of the garnet groups may include pyrope, $Mg_3Al_2Si_3O_{12}$, grossular, $Ca_2Al_2Si_3O_{12}$, and combinations thereof. The aluminosilicates may include, but are not limited to, sillimanite, $Al_2SiO_5$, mullite, $3Al_2O_3.2SiO_2$, kyanite, $Al_2SiO_5$ and combinations thereof. The ring silicates may include, but are not limited to, cordierite, $Al_3(MgFe)_2[Si_4AlO_{18}]$, and combinations thereof. The chain silicates may include, but are not limited to, wollastonite, $Ca[SiO_3]$, and combinations thereof. Suitable examples of the sheet silicates that are not limiting may include mica, $K_2Al_{14}[Si_6Al_2O_{20}](OH)_4$, pyrophyllite, $Al_4[Si_8O_{20}](OH)_4$, talc, $Mg_6[Si_8O_{20}](OH)_4$, serpentine, asbestos, Kaolinite, $Al_4[Si_4O_{10}](OH)_8$, vermiculite, and combinations thereof. Low density fillers may also be included to reduce weight and cost per volume. The fillers may include particles that are smaller than ¼ of the wavelength of light to avoid scattering but this is not required. Thus, fillers such as wollastonite, silica, titanium dioxide, glass fibers, hollow glass spheres and clays e.g. kaolin are particularly preferred.

In one embodiment, the filler is selected from the group consisting of aluminum nitride, aluminum oxide, aluminum trihydrate, barium titanate, beryllium oxide, boron nitride, carbon fibers, diamond, graphite, magnesium hydroxide, magnesium oxide, metal particulate, onyx, silicon carbide, silicon, tungsten carbide, zinc oxide, and a combination thereof. The filler may be further defined as a metallic filler, an inorganic filler, a meltable filler, or a combination thereof. Metallic fillers include particles of metals and particles of metals having layers on the surfaces of the particles. These layers may be, for example, metal nitride layers or metal oxide layers on the surfaces of the particles. Suitable metallic fillers are exemplified by particles of metals selected from aluminum, copper, gold, nickel, silver, and combinations thereof, and alternatively aluminum. Suitable metallic fillers are further exemplified by particles of the metals described above having layers on their surfaces selected from aluminum nitride, aluminum oxide, copper oxide, nickel oxide, silver oxide, and combinations thereof. For example, metallic filler may include aluminum particles having aluminum oxide layers on their surfaces.

Suitable inorganic fillers include, but are not limited to, onyx, aluminum trihydrate, metal oxides such as aluminum oxide, beryllium oxide, magnesium oxide, and zinc oxide, nitrides such as aluminum nitride and boron nitride, carbides such as silicon carbide and tungsten carbide.

Suitable meltable fillers include, but are not limited to, Bi, Ga, In, Sn, Ag, Au, Cd, Cu, Pb, Sb, Zn, alloys thereof, and combinations thereof. Non-limiting examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The meltable filler may have a melting point ranging from 50° C. to 250° C. or from 150° C. to 225° C. The meltable filler may be a eutectic alloy, a non-eutectic alloy, or a pure metal. Suitable meltable fillers are commercially available from Indium Corporation of America, of Utica, N.Y., Arconium, of Providence, R.I., and ATM Solder of Cranston, R.I. Suitable aluminum fillers are commercially available from Toyal America, Inc. of Naperville, Ill. and Valimet Inc. of Stockton, Calif. Silver fillers are commercially available from Metalor Technologies U.S.A. Corp. of Attleboro, Mass.

Additional examples of suitable fillers include, but are not limited to, precipitated calcium carbonate, ground calcium carbonate, fumed silica, precipitated silica, talc, titanium dioxide, plastic powders, glass or plastic (such as Saran™) microspheres, high aspect ratio fillers such as mica or exfoliated mica, and combinations thereof. The filler may optionally be treated with a treating agent, such as a fatty acid (e.g., stearic acid). Precipitated calcium carbonate is available from Solvay under the trade name WINNOFIL® SPM. Ground calcium carbonate is available from (SCI Britannic of Miami, Fla., U.S.A. under the trade name Imerys Gammasperse. Carbon black, such as 1011, is commercially available from Williams. Silica is commercially available from Cabot Corporation.

The filler may be further defined as a single thermally conductive filler or a combination of two or more thermally conductive fillers that differ in at least one property such as particle shape, average particle size, particle size distribution, and type of filler. For example, it may be desirable to use a combination of inorganic fillers, such as a first aluminum oxide having a larger average particle size and a second aluminum oxide having a smaller average particle size. Alternatively, it may be desirable, for example, use a combination of an aluminum oxide having a larger average particle size with a zinc oxide having a smaller average particle size. Alternatively, it may be desirable to use combinations of metallic fillers, such as a first aluminum having a larger average particle size and a second aluminum having a smaller average particle size. For example, the first aluminum may have an average particle size ranging from 8 micrometers to 100 micrometers, alternatively 8 micrometers to 10 micrometers. The second aluminum may have an average particle size ranging from 0.1 micrometer to 5 micrometers, alternatively 1 micrometer to 3 micrometers. Alternatively, it may be desirable to use combinations of metallic and inorganic fillers, such as a combination of metal and metal oxide fillers, e.g., a combination of aluminum and aluminum oxide fillers; a combination of aluminum and zinc oxide fillers; or a combination of aluminum, aluminum oxide, and zinc oxide fillers. Using a first filler having a larger average particle size and a second filler having a smaller average particle size than the first filler may improve packing efficiency, may reduce viscosity, and may enhance heat transfer. It is contemplated that any of the above fillers may be used in combination if desired.

An average particle size of thermally conductive fillers depends on various factors including the type of thermally conductive filler and the amount used. However, in various embodiments, the thermally conductive filler has an average particle size ranging from 0.1 micrometer to 100 micrometers, alternatively 0.1 micrometer to 80 micrometers, alternatively 0.1 micrometer to 50 micrometers, and alternatively 0.1 micrometer to 10 micrometers.

In various embodiments, the silicone composition includes from 10 to 70, from 20 to 60, from 40 to 60, or from 30 to 50, parts by weight of the filler per 100 parts by weight of the silicone composition. In one embodiment, the silicone composition includes from 45 to 55 parts by weight of a quartz filler per 100 parts by weight of the silicone composition. In an additional embodiment, the silicone composition includes from 1 to 150 parts by weight of a filler per 100 parts by weight of the silicone composition. In a further embodiment, the silicone composition includes about 50 parts by weight of a quartz filler per 100 parts by weight of the silicone composition. In yet another embodiment, the silicone composition includes a filler selected from the group of quartz, silicon, aluminum oxide, aluminum trihydrate, and combinations thereof present in an amount of from 10 to 80 parts by weight per 100 parts by weight of the silicone composition.

The aforementioned fillers may be surface treated with fatty acids or fatty acid esters such as stearates, organosilanes, organosiloxanes, organosilazanes such as hexaalkyl disilazane, and/or short chain siloxane diols, and combinations thereof to render the filler hydrophobic. This surface treatment may make the fillers easier to handle and obtain a homogeneous mixture with the other components of the silicone composition. The surface treatment may also make ground silicate minerals easily wetted. Without intending to be limited, it is believed that the surface modified fillers resist clumping and can be homogeneously incorporated into the silicone composition, thus resulting in improved room temperature mechanical properties. Furthermore, it is believed that the surface treated fillers are less electrically conductive than non-treated fillers. As described above, a heat conducting filler may be used when the first outermost layer 22 is also thermally conductive thus enabling the removal of excess heat from the photovoltaic cells 24 which improves cell efficiency.

In addition to the fillers, the silicone composition may also include an additive such as a hydrosilylation catalyst inhibitor such as 3-methyl-3-penten-1-yne, 3,5-dimethyl-3-hexen-1-yne, 3,5-dimethyl-1-hexyn-3-ol, 1-ethynyl-1-cyclohexanol, 2-phenyl-3-butyn-2-ol, vinylcyclosiloxanes, and triphenylphosphine. Other non-limiting examples of additives include pigments, adhesion promoters, corrosion inhibitors, dyes, diluents, anti-soiling additives, and combinations thereof. Inclusion of such additives may be based on shelf-life, cure kinetics and optical properties of the tie layer 26.

Particularly preferred examples of suitable adhesion promoters may include, but are not limited to, vinyltriethoxysilane, acrylopropyltrimethoxysilanes, alkylacrylopropyltrimethoxysilanes such as methacryloxypropyltrimethoxysilane, alkoxysilanes, allyltriethoxysilane, glycidopropyltrimethoxysilane, allylglycidylether, hydroxydialkyl silyl terminated methylvinylsiloxane-dimethylsiloxane copolymer, a reaction product of hydroxydialkyl silyl terminated methylvinylsiloxane-dimethylsiloxane copolymer with glycidopropyltrimethoxysilane, bis-triethoxysilyl ethylene glycol, hydroxydialkyl silyl terminated methylvinylsiloxane-dimethylsiloxane copolymer, a reaction product of hydroxydialkyl silyl terminated methylvinylsiloxane-dimethylsiloxane copolymer with glycidopropyltrimethoxysilane and bis-triethoxysilyl ethylene glycol, a 0.5:1 to 1:2, and more typically a 1:1 mixture of the hydroxydialkyl silyl terminated methylvinylsiloxane-dimethylsiloxane copolymer and a methacrylopropyltrimethoxysilane, and combinations thereof.

As described above, the additive may include anti-soiling additives to reduce/prevent soiling when the photovoltaic cells 24 are in use. Particularly preferred anti-soiling additives include, but are not limited to, fluoroalkenes and fluorosilicones that have viscosities of 10,000 mPa·s at 25° C. such as fluorinated silsesquioxanes including dimethylhydrogensiloxy terminated trifluoropropyl silsesquioxane, hydroxy-terminated trifluoropropylmethyl siloxane, hydroxy-terminated trifluoropropylmethylsilyl methylvinylsilyl siloxane, 3,3,4,4,4,5,5,6,6,7,7,8,8,8-tridecafluorooctyltriethoxysilane, hydroxy-terminated methylvinyl, trifluoropropylsiloxane, dimethylhydrogensiloxy-terminated dimethyl trifluoropropylmethyl siloxane, and combinations thereof. The anti-soiling additive is typically present in an amount of 5 or less parts by weight per 100 parts by weight of the silicone composition.

The silicone composition may also include optical brighteners capable of absorbing solar energy at the lower wavelengths (200-500 nm) and re-emitting at higher wavelengths (600-900 nm), rheological modifiers, pigments, heat stabilizers, flame retardants, UV stabilizers, chain extenders, plasticizers, extenders, fungicides and/or biocides and the like (which may be present in an amount of from 0 to 0.3% by weight), water scavengers, pre-cured silicone and/or organic rubber particles to improve ductility and maintain low surface tack, and combinations thereof.

Suitable examples of the fire retardants include alumina powder or wollastonite as described in WO 00/46817, which is expressly incorporated herein by reference relative to these fire retardants. The fire retardant may be used alone or in combination with other fire retardants or a pigment such as titanium dioxide.

Any reactions of this invention, such as hydrosilylation reactions, may be carried out in any standard reactor suitable or may occur on the module 22. Suitable reactors include glass and Teflon-lined glass reactors. Typically, the reactor is equipped with a means of agitation, such as stirring. The reaction is typically carried out in an inert atmosphere, such as nitrogen or argon, in the absence of moisture.

The silicone composition of this invention may be tacky or non-tacky and may be a gel, gum, liquid, paste, resin, or solid. In the method of this invention, the silicone composition is liquid and is disposed on the photovoltaic cell 24. In one embodiment, the silicone composition is a film. In another embodiment, the silicone composition is a gel. In yet another embodiment, the silicone composition is a liquid that is cured (e.g. pre-cured or partially cured) to form a gel. Alternatively, the silicone composition may include multiple segments, with each segment including a different silicone and/or different form (e.g. gel and liquid). In one embodiment, the silicone composition consists essentially of the organosilicon compound, the organohydrogensilicon compound, and the hydrosilylation catalyst and does not include any additional silicones, fillers, cross-linkers, and/or additives. Alternatively, the silicone composition may consist of the organosilicon compound, the organohydrogensilicon compound, and the hydrosilylation catalyst.

The silicone composition may be uncured, partially cured, or completely cured via a hydrosilylation mechanism or any of the other mechanisms introduced above. In one embodiment, the silicone composition is cured at a temperature of from 0° C. to 150° C. Alternatively, the silicone composition may be cured at a temperature of from 50° C. to 150° C. or at a temperature of from room temperature (~23° C.±2° C.) to 115° C. However, other temperatures may be used, as selected by one of skill in the art. If the silicone composition is cured with heat, heating may occur in any suitable oven or the like in either a batch or continuous mode. A continuous mode is most preferred. Additionally, the silicone composition may be cured for a time of from 1 to 24 hours. However, the silicone composition may be cured for a shorter or longer time, as selected by one of skill in the art depending on application. In various embodiments, the silicone composition has a viscosity of less than about 100,000, from 50 to 10,000, from 100 to 7,500, from 250 to 5,000, from 250 to 10,000, from 25 to 800, from 2,500 to 5,000, from 250 to 600, from 3,000 to 4,000, or from 2,000 to 8,000 centipoise (cps) at 25° C. In alternative embodiments, the silicone composition has a viscosity of about 400 or about 3,500 cps at 25° C. The viscosity of the silicone composition may be calculated using ASTM D1084 or ASTM D4287.

Figure 7:
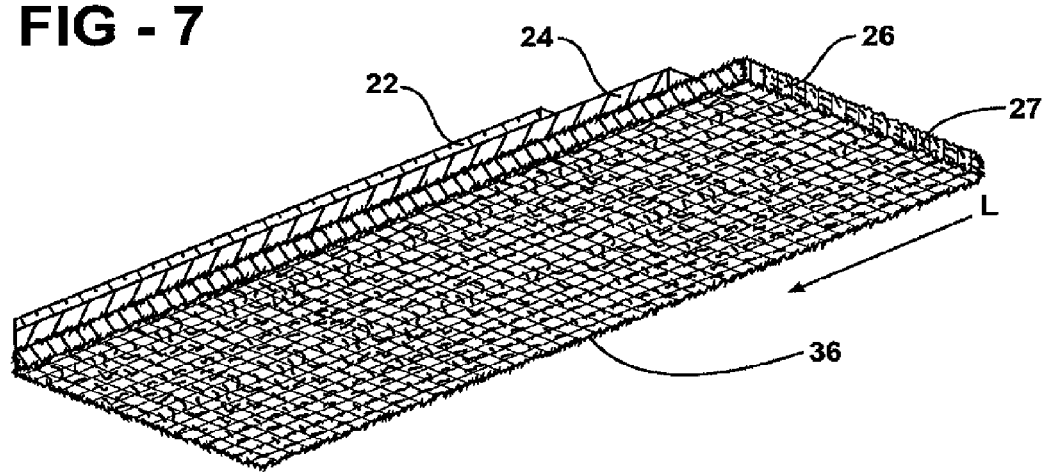
FIG. 7 is a bottom cross-sectional view of the photovoltaic cell module of FIG. 1 wherein the plurality of fibers extends laterally (L) across the second layer to a periphery of the photovoltaic cell module on both ends of the module to resist leakage of the silicone composition from the photovoltaic cell module.
Figure 8:
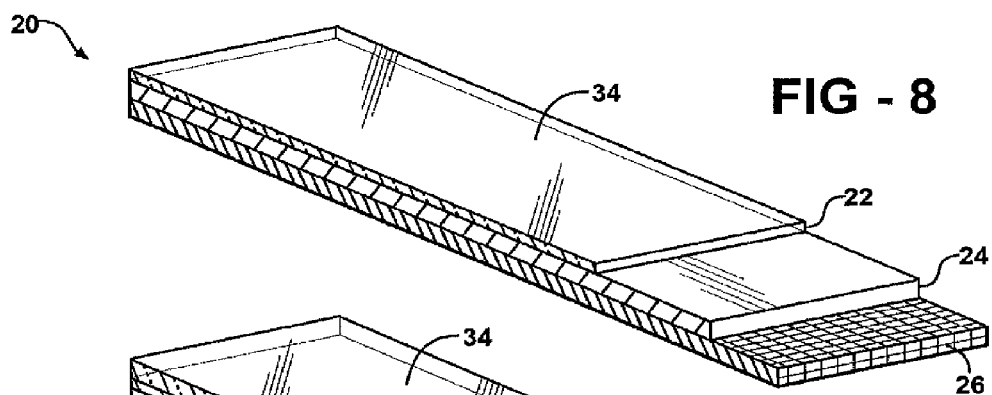
FIG. 8 is a side cross-sectional view of a photovoltaic cell module including a first outermost layer, a photovoltaic cell disposed on the first outermost layer, and a second outermost layer disposed on the photovoltaic cell wherein the second outermost layer is free of a plurality of fibers and is formed from a hydrosilylation-curable silicone composition.

Referring back, in one embodiment, as set forth in FIG. 7, the plurality of fibers 27 at least partially coated with the silicone composition extends laterally (L), i.e., in a lateral direction, across the second (outermost) layer 26 to a periphery (36) of the module 20 on both ends of the module. In one embodiment, the plurality of fibers 27 at least partially coated with the silicone composition extends laterally (L) across the second (outermost) layer 26 to the periphery (36) of the module 20 at all ends of the module. The terminology "ends", as used herein, includes the front, rear, and/or side periphery of the module 20. The plurality of fibers 27 may completely extend from one end of the module 20 to the other. The plurality of fibers 27 may be coated in some sections and not coated in others or may be completely coated. In one embodiment, uncoated fibers 27 extend across a portion of the second (outermost) layer 26 to the periphery 36 while coated fibers extend across another portion of the second (outermost) layer 26. The plurality of fibers 27 and/or the second (outermost) layer 26 may totally cover the photovoltaic cell 24 when disposed on the photovoltaic cell 24. Alternatively, the plurality of fibers 27 and/or the second (outermost) layer 26 may not totally cover the photovoltaic cell 26 when disposed thereon and may leave gaps.

The second (outermost) layer 26 including the plurality of fibers 27 is typically the same size as the first outermost layer 22 and the photovoltaic cell 24. However, in one embodiment, the second (outermost) layer 26 is smaller than the photovoltaic cell 24 and only extends over a portion of the photovoltaic cell 24. In a further embodiment, the second (outermost) layer 26 has a length and width of 125 mm each. In yet another embodiment the second (outermost) layer 26 has a length and width of 156 mm each. Of course it is to be understood that plurality of fibers 27 and the second (outermost) layer 26, and the instant invention, are not limited to these dimensions.

Referring back to the module 20, the module 20 may also include a supporting layer 28. The supporting layer 28 may be the same or different than the first outermost layer 22. In one embodiment, the supporting layer 28 is a second outermost layer disposed on the second layer 26 when the second layer 26 is an interior layer. In this embodiment, the supporting layer 28 is disposed opposite the first outermost layer 22 and is used for supporting the module 20. In an alternative embodiment, the supporting layer 28 includes glass. In another embodiment, the supporting layer 28 includes at least one of a polyimide, polyethylene, an ethylene-vinyl acetate copolymer, an organic fluoropolymer including, but not limited to, ethylene tetrafluoroethylene (ETFE), poly vinylfluoride (Tedlar®), polyester/Tedlar®, Tedlar®/polyester/Tedlar®, polyethylene terephthalate (PET) alone or at least partially coated with silicon and oxygen based materials ($SiO_X$), and combinations thereof. In another embodiment, the supporting layer 28 includes Tedlar®. As is known in the art, Tedlar® is polyvinylfluoride. In one embodiment, the supporting layer 28 is selected from the group of polyvinylfluoride and polyethylene.

Typically, the supporting layer 28 has a thickness of from 50 to 500, more typically of from 100 to 225, and most typically of from 175 to 225, micrometers. In one embodiment, the supporting layer 28 has a length and width of 125 mm each. In another embodiment, the supporting layer 28 has a length and width of 156 mm each. Of course it is to be understood that the supporting layer 28, and the instant invention, are not limited to these dimensions.

In addition to the second (outermost) layer 26 and the supporting layer 28, the module 20 may also include a tie layer 30. The tie layer 30 may be disposed on the photovoltaic cell 24 and sandwiched between the photovoltaic cell 24 and the first outermost layer 22. Alternatively, the tie layer 30 may be disposed in any other portion of the module 20. The module 20 may include more than one tie layer 30 and may include second, third, and/or additional tie layers. The second, third, and/or additional tie layers may be the same or different than the tie layer 30. The tie layer 30 may include a second silicone composition with may be the same or different from the silicone composition described above. In one embodiment, the second silicone composition is different from the silicone composition described above.

In one embodiment, as shown in FIGS. 3, 4, 10 and 11, the module 20 includes the tie layer 30 disposed on the first outermost layer 22 and sandwiched between the first outermost layer 22 and the photovoltaic cell 24. The tie layer 30 may be transparent to UV and/or visible light, impermeable to light, or opaque.

The tie layer 30 may have a penetration of from 1.1 to 100 mm. In various embodiments, the tie layer 30 has a penetration of from 1.3 to 100 mm and more typically of from 2 to 55 mm. The penetration is determined by first calculating hardness and then calculating penetration. Thus, the tie layer 30 typically has a hardness in grams (g) of Force of from 5 to 500, more typically of from 5 to 400, and most typically of from 10 to 300. More specifically, hardness is determined using a TA-XT2 Texture Analyzer commercially available from Stable Micro Systems using a 0.5 inch (1.27 cm) diameter steel probe. Test samples of the tie layer 30 having a mass of 12 g are heated at 100° C. for 10 minutes and are analyzed for hardness using the following testing parameters, as known in the art: 2 mm/sec pre-test and post-test speed; 1 mm/s test speed; 4 mm target distance; 60 second hold; and a 5 g force trigger value. The maximum grams force is measured at 4 mm distance into the tie layer 30.

The tie layer 30 may also have a tack value of less than $-0.6$ g·sec. In various embodiments, the tie layer 30 has a tack value of from $-0.7$ to $-300$ g·sec and more typically of from $-1$ to $-100$ g·sec. In one embodiment, the tie layer 30 has a tack value of about $-27$ g·sec. The tack value is determined using a TA-XT2 Texture Analyzer commercially available from Stable Micro Systems using a 0.5 inch (1.27 cm) diameter steel probe. The probe is inserted into the tie layer 30 to a depth of 4 mm and then withdrawn at a rate of 2 mm/sec. The tack value is calculated as a total area (Force-Time) during withdrawal of the probe from the tie layer 30. The tack value is expressed in gram·sec.

The tie layer 30 is typically tacky and may be a gel, gum, liquid, paste, resin, or solid. In one embodiment, the tie layer 30 is a film. In another embodiment, the tie layer 30 is a gel. In yet another embodiment, the tie layer 30 is a liquid that is cured (e.g. pre-cured) to form a gel. Alternatively, the tie layer 30 may include multiple segments, with each segment including a different composition and/or different form (e.g. gel and liquid), so long as the segments and the overall tie layer 30 have the appropriate penetration and tack values, set forth above. Examples of suitable gels for use as the tie layer 30 are described in U.S. Pat. Nos. 5,145,933, 4,340,709, and 6,020,409, each of which is expressly incorporated herein by reference relative to these gels. It is to be understood that the tie layer 30 can have any form. Typically, the tie layer 30 has a viscosity of from 10 to 100,000 mPa·s measured at 25° C. according to ASTM D4287 using a Brookfield DVIII Cone and Plate Viscometer. The tie layer 30 also typically has an elastic modulus (G' at cure) of from $7\times10^2$ to $6\times10^5$, dynes/cm$^2$.

In one embodiment, the tie layer 30 is substantially free of entrapped air (bubbles). The terminology "substantially free" means that the tie layer 30 has no visible air bubbles. In another embodiment, the tie layer 30 is totally free of entrapped air including both visible and microscopic air bubbles.

The tie layer 30 may be formed from any suitable compound known in the art. The tie layer 30 may be formed from and/or include an inorganic compound, and organic compound, or a mixture of organic and inorganic compounds. These compounds may or may not require curing. In one embodiment, the tie layer 30 is formed from a curable composition including silicon atoms. The tie layer 30 may be formed completely from a curable silicone composition such as those disclosed in U.S. Pat. Nos. 6,020,409 and 6,169,155, herein expressly incorporated by reference relative to these curable silicone compositions. In another embodiment, the curable composition of the tie layer 30 includes at least one of an ethylene-vinyl acetate copolymer, a polyurethane, an ethylene tetrafluoroethylene, a polyvinylfluoride, a polyethylene terephthalate, and combinations thereof. Alternatively, the tie layer 30 may be formed from a curable composition including one or more of components (A)-(E). Component (A) may include any organic and/or inorganic compounds known in the art and may include both carbon and silicon atoms. Typically, component (A) includes a diorganopolysiloxane. The diorganopolysiloxane may have high number ($M_n$) and/or weight average ($M_w$) molecular weights and may be a silicone gum having at least two reactive groups per molecule that are designed to cure with component (B), described in greater detail below. Alternatively, the diorganopolysiloxane may be a resin or may include a gum and a resin. The diorganopolysiloxane typically has a molecular structure which is substantially linear. However, this structure may be partially branched. In one embodiment, the diorganopolysiloxane is the same as the organosilicon compound defined above. Of course, it is to be understood that component (A) may be selected independently of the organosilicon compound.

Suitable examples of component (A) include, but are not limited to, dimethylalkenylsiloxy-terminated dimethylpolysiloxanes, dimethylalkenylsiloxy-terminated copolymers of methylalkenylsiloxane and dimethylsiloxane, dimethylalkenylsiloxy-terminated copolymers of methylphenylsiloxane and dimethylsiloxane, dimethylalkenylsiloxy-terminated copolymers of methylphenylsiloxane, methylalkenylsiloxane, and dimethylsiloxane, dimethylalkenylsiloxy-terminated copolymers of diphenylsiloxane and dimethylsiloxane, dimethylalkenylsiloxy-terminated copolymers of diphenylsiloxane, methylalkenylsiloxane, and dimethylsiloxane, and combinations thereof.

Alternatively, component (A) may include a compound having hydroxyl or hydrolysable groups X and $X^1$ which may be the same or different. These groups may or may not be terminal groups and are typically not sterically hindered. For example, this compound may have the general formula:

X-A-$X^1$ wherein X and/or $X^1$ may include and/or terminate with any of the following groups: —Si(OH)$_3$, —(R$^a$)Si(OH)$_2$, —(R$^a$)$_2$SiOH, —R$^a$Si(OR$^b$)$_2$, —Si(OR$^b$)$_3$, —R$^a{}_2$SiOR$^b$ or —R$^a{}_2$Si—R$^c$—SiR$^d{}_p$(OR$^b$)$_{3-p}$ where each R$^a$ may independently include a monovalent hydrocarbyl group such as an alkyl group having from 1 to 8 carbon atoms. Typically, R$^a$ is a methyl group. Each R$^b$ and R$^d$ may independently be an alkyl group having up to 6 carbon atoms or alkoxy group. R$^c$ is typically a divalent hydrocarbon group which may include one or more siloxane spacers having up to six silicon atoms. Typically, p has a value 0, 1 or 2. In one embodiment, X and/or $X^1$ include functional groups which are hydrolysable in the presence of moisture.

Additionally, in this formula, (A) typically includes a siloxane molecular chain. In one embodiment, (A) includes a polydiorgano-siloxane chain having siloxane units of the following formula

wherein each R$^6$ is independently an organic group such as a hydrocarbyl group having from 1 to 10 carbon atoms that is optionally substituted with one or more halogen group such as chlorine or fluorine, and s is 0, 1 or 2. More specifically, R$^6$ may include methyl, ethyl, propyl, butyl, vinyl, cyclohexyl, phenyl, and/or tolyl groups, propyl groups substituted with chlorine or fluorine such as 3,3,3-trifluoropropyl, chlorophenyl, beta-(perfluorobutyl)ethyl or chlorocyclohexyl groups, and combinations thereof. Typically, at least some of the groups R$^6$ are methyl groups. Most typically, all of the R$^6$ groups are methyl groups. In one embodiment, there are at least approximately 700 units of the above formula per molecule.

Typically, component (A) has a viscosity of greater than 50 mPa·s. In one embodiment, component (A) has a viscosity of greater than 1,000,000 mPa·s. In another embodiment, component (A) has a viscosity of 50 to 1,000,000, more typically of from 100 to 250,000, and most typically of from 100 to 100,000, mPa·s. Each of the aforementioned viscosities are measured at 25° C. according to ASTM D4287 using a Brookfield DVIII Cone and Plate Viscometer. Component (A) is typically present in the curable composition of the tie layer 30 in an amount of from 25 to 99.5 parts by weight, per 100 parts by weight of the curable composition of the tie layer 30.

In some embodiments, component (A) has a degree of polymerization (dp) of above 1500 and a Williams plasticity number, as determined using ASTM D926, of from 95 to 125. The plasticity number, as used herein, is defined as a thickness in millimeters×100 of a cylindrical test specimen 2 cm$^3$ in volume and approximately 10 mm in height after the specimen has been subjected to a compressive load of 49 Newtons for three minutes at 25° C.

Referring now to component (B), this component typically includes a silicone resin (M, D, T, and/or Q) or mixture of resins. The resin(s) may or may not include functional groups that could react with component (A). Component (B) may be combined with component (A) with or without solvent. More specifically, component (B) may include an organosiloxane resin such as an MQ resin including R$^6{}_3$SiO$_{1/2}$ units and SiO$_{4/2}$ units, a TD resin including R$^6$SiO$_{3/2}$ units and R$^6{}_2$SiO$_{2/2}$ units, an MT resin including R$^6{}_3$SiO$_{1/2}$ units and R$^6$SiO$_{3/2}$ units, an MTD resins including R$^6{}_3$SiO$_{1/2}$ units, R$^6$SiO$_{3/2}$ units, and R$^6{}_2$SiO$_{2/2}$ units, and combinations thereof. In these formulas, R$^6$ is as described above.

The symbols M, D, T, and Q used above represent the functionality of structural units of polyorganosiloxanes including organosilicon fluids, rubbers (elastomers) and resins. The symbols are used in accordance with established understanding in the art. Thus, M represents the monofunctional unit R$^6{}_3$SiO$_{1/2}$. D represents the difunctional unit R$^6{}_2$SiO$_{2/2}$. T represents the trifunctional unit R$^6$SiO$_{3/2}$. Q represents the tetrafunctional unit $SiO_{4/2}$. Generic structural formulas of these units are shown below:

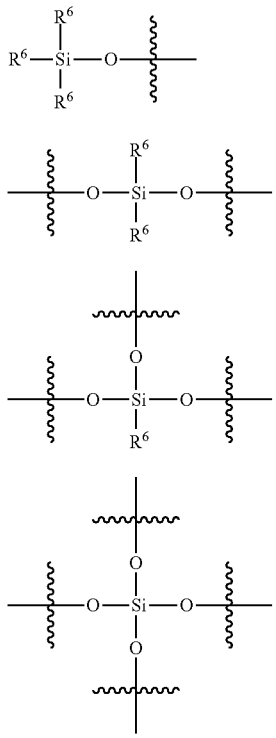

Typically, the weight average molecular weight of component (B) is at least 5,000 and typically greater than 10,000 g/mol. Component (B) is typically present in the curable composition of the tie layer 30 in an amount of from 0.5 to 75 parts by weight per 100 parts by weight per 100 parts by weight of the curable composition of the tie layer 30.

Without intending to be bound by any particular theory, it is believed that the aforementioned components (A) and (B) impart outstanding UV resistance to the tie layer 30. Use of these silicones may reduce or eliminate a need to include a UV additive or cerium doped glass in the module 20. These silicones may also exhibit long term UV and visual light transmission thereby maximizing an efficiency of the module 20.

Referring now to component (C), this component typically includes a curing catalyst. The catalyst may be of any type known in the art and typically is selected from the group of condensation catalysts, hydrosilylation catalysts, radical catalysts, UV catalysts, thermal catalysts, and combinations thereof. Choice of this catalyst may reduce production and processing times by >20% and may eliminate certain production steps altogether, thereby leading to decreased production costs and purchasing costs for the end user.

In one embodiment, component (C) is the same as the hydrosilylation catalyst introduced above. In another embodiment, component (C) includes a peroxide catalyst which is used for free-radical based reactions between siloxanes including, but not limited to, ≡Si—CH₃ groups and other ≡Si—CH₃ groups or ≡Si—CH₃ groups and ≡Si-alkenyl groups (typically vinyl), or ≡Si-alkenyl groups and ≡Si-alkenyl groups. Suitable peroxide catalysts may include, but are not limited to, 2,4-dichlorobenzoyl peroxide, benzoyl peroxide, dicumyl peroxide, tert-butyl perbenzoate. 1,1-bis(t-butylperoxy)-3,3,5-trimethylcyclohexane (TMCH) (2,5-bis(t-butylperoxy)-2,5-dimethylhexane) catalyst 1,1-bis(tert-amylperoxy)cyclohexane, ethyl 3,3-bis(tert-amylperoxy)butyrate, 1,1-bis(tert-butylperoxy) cyclohexane, and combinations thereof. These catalysts may be utilized as a neat compound or in an inert matrix (liquid or solid).

Typically, when one or more peroxide catalysts are used, a temperature at which curing is initiated is generally determined/controlled on a basis of a half-life of the catalyst. However, a rate of cure and ultimate physical properties of the curable compound and the tie layer 30 are controlled by a level of unsaturation of compounds used to form the tie layer 30. Additionally, reaction kinetics and physical properties can be tuned by blending linear non-reactively endblocked polymers with differing degrees of polymerization (dp) with dimethylmethylvinyl-copolymers with or without vinyl endblocking.

In yet another embodiment, component (C) includes a condensation catalyst and may also include a combination of the condensation catalyst with one or more silanes or siloxane based cross-linking agents which include silicon bonded hydrolysable groups such as acyloxy groups (for example, acetoxy, octanoyloxy, and benzoyloxy groups), ketoximino groups (for example dimethyl ketoxime and isobutylketoximino groups), alkoxy groups (for example methoxy, ethoxy, and propoxy groups), alkenyloxy groups (for example isopropenyloxy and 1-ethyl-2-methylvinyloxy groups), and combinations thereof. It is also contemplated that condensation catalysts may be used in component (C) when the curable composition of the tie layer 30 includes resin polymer blends that are prepared such that they form a sheeting material that, on exposure to a moist atmosphere, reacts to form a permanent network. Alternatively, condensation catalysts may be used in component (C) when the curable composition of the tie layer 30 includes alkoxy-functional silicone polymers that are capable of co-reacting with the moisture triggered polymers.

Component (C) may include any suitable condensation catalyst known in the art. More specifically, the condensation catalyst may include, but is not limited to, tin, lead, antimony, iron, cadmium, barium, manganese, zinc, chromium, cobalt, nickel, aluminum, gallium, germanium, zirconium, and combinations thereof. Non-limiting particularly suitable condensation catalysts include alkyltin ester compounds such as dibutyltin dioctoate, dibutyltin diacetate, dibutyltin dimaleate, dibutyltin dilaurate, butyltin 2-ethylhexoate, 2-ethylhexoates of iron, cobalt, manganese, lead and zinc, and combinations thereof.

Alternatively, the condensation catalyst may include titanates and/or zirconates having the general formula Ti[OR]₄ or Zr[OR]₄ respectively, wherein each R may be the same or different and represents a monovalent, primary, secondary or tertiary aliphatic hydrocarbon group which may be linear or branched and have from 1 to 10 carbon atoms. In one embodiment, the condensation catalyst includes a titanate including partially unsaturated groups. In another embodiment, the condensation catalyst includes titanates and/or zirconates wherein R includes methyl, ethyl, propyl, isopropyl, butyl, tertiary butyl, and/or branched secondary alkyl groups such as 2,4-dimethyl-3-pentyl, and combinations thereof. Typically, when each R is the same, R is an isopropyl group, branched secondary alkyl group or a tertiary alkyl group, and, in particular, a tertiary butyl group. Alternatively, the titanate may be chelated. Chelation may be accomplished with any suitable chelating agent such as an alkyl acetylacetonate such as methyl or ethylacetylacetonate. Examples of suitable titanium and/or zirconium based catalysts are described in EP 1254192 which is expressly incorporated herein by reference relative to these catalysts. Typically, the condensation catalyst, if utilized, is present in an amount of from 0.01 to 3% by weight of the total curable composition of the tie layer 30.

Component (C) may alternatively include a cationic initiator which can be used when the curable composition of the tie layer 30 includes cycloaliphatic epoxy functionality. Typically, the cationic initiators are suitable for thermal and/or UV cure and may be used when the curable composition of the tie layer 30 includes iodonium or sulfonium salts that will produce a cured network upon heating. In one embodiment, the cationic initiator is used in combination with a radical initiator. This combination can be cured by UV-visible irradiation when sensitized with suitable UV-visible radical initiators such those described above.

Referring now to component (D), this component includes a cross-linking agent which may have a linear, partially branched linear, cyclic, or a net-like structure. The cross-linking agent may be included independently of, or in combination with, the catalysts described above. The cross-linking agent may be any known in the art and typically includes the organohydrogensilicon compound described above. Of course, it is to be understood that component (D) may be selected independently of the organohydrogensilicon compound.

In various embodiments, the cross-linking agent may have two but typically has three or more silicon-bonded hydrolysable groups per molecule. If the cross-linking agent is a silane and has three silicon-bonded hydrolysable groups per molecule, the cross-linking agent may also include a non-hydrolysable silicon-bonded organic group. These silicon-bonded organic groups are typically hydrocarbyl groups which are optionally substituted by halogen such as fluorine and chlorine. Examples of suitable groups include, but are not limited to, alkyl groups such as methyl, ethyl, propyl, and butyl groups, cycloalkyl groups such as cyclopentyl and cyclohexyl groups, alkenyl groups such as vinyl and allyl groups, aryl groups such as phenyl and tolyl groups, aralkyl groups such as 2-phenylethyl groups, and halogenated derivatives thereof. Most typically, the non-hydrolysable silicon-bonded organic group is a methyl group.

In another embodiment, the cross-linking agent includes one or more silanes including hydrolysable groups such as acyloxy groups (e.g. acetoxy, octanoyloxy, and benzoyloxy groups), ketoximino groups (e.g. dimethyl ketoximo and isobutylketoximino groups), alkoxy groups (e.g. methoxy, ethoxy, and propoxy groups), alkenyloxy groups (e.g. isopropenyloxy and 1-ethyl-2-methylvinyloxy groups), and combinations thereof. These siloxanes may be straight chained, branched, or cyclic.

As described above, the cross-linking agent may be combined with the aforementioned catalyst of component (C). In one embodiment, the cross-linking agent includes oximosilanes and/or acetoxysilanes and is combined with a tin catalyst such as diorganotin dicarboxylate, dibutyltin dilaurate, dibutyltin diacetate, dimethyltin bisneodecanoate, and combinations thereof. In another embodiment, the cross-linking agent includes alkoxysilanes combined with titanate and/or zirconate catalysts such as tetrabutyl titanate, tetraisopropyl titanate, chelated titanates or zirconates such as diisopropyl bis(acetylacetonyl)titanate, diisopropyl bis(ethylacetoacetonyl)titanate, diisopropoxytitanium bis(ethylacetoacetate), and combinations thereof. Alternatively, the cross-linking agent may include one or more silanes or siloxanes which may include silicon bonded hydrolysable groups such as acyloxy groups (for example, acetoxy, octanoyloxy, and benzoyloxy groups), ketoximino groups (for example dimethyl ketoximo and isobutylketoximino groups), alkoxy groups (for example methoxy, ethoxy, and propoxy groups) and alkenyloxy groups (for example isopropenyloxy and 1-ethyl-2-methylvinyloxy groups). In the case of siloxanes, the molecular structure can be straight chained, branched, or cyclic.

The curable composition of the tie layer 30 may also include component (E). This component typically includes a highly functional modifier. Suitable modifiers include, but are not limited to, methyl vinyl cyclic organopolysiloxane structures ($E^{vi}_x$) and branched structures such as ($M^{vi}E_x)_4Q$ structures, which are described in EP 1070734 which is expressly incorporated herein by reference relative to these structures. If included, component (E) may be used in amounts determined by those of skill in the art.

In addition to components (A-E), the curable composition of the tie layer 30 may further include a block copolymer and/or a mixture of a block copolymer and a silicone resin. The block copolymer may be used alone but is typically cured using one of the catalysts described above. The block copolymer may include a thermoplastic elastomer having a "hard" segment (i.e., having a glass transition point $T_g \geq$ the operating temperature of the module 20) and a "soft" segment (i.e., having a glass transition point $T_g \leq$ the operating temperature of the module 20). Typically, the soft segment is an organopolysiloxane segment. It is contemplated that the block copolymer may be an AB, an ABA, or $(AB)_n$ block copolymer.

More specifically, these block co-polymers may be prepared from a hard segment polymer prepared from an organic monomer or oligomer or combination of organic monomers and/or oligomers including, but not limited to, styrene, methylmethacrylate, butylacrylate, acrylonitrile, alkenyl monomers, isocyanate monomers and combinations thereof. Typically, the hard segment polymer is combined or reacted with a soft segment polymer prepared from a compound having at least one silicon atom such as an organopolysiloxane polymer. Each of the aforementioned hard and soft segments can be linear or branched polymer networks or combination thereof.

Preferred block-copolymers include silicone-urethane and silicone-urea copolymers. Silicone-urethane and silicone-urea copolymers, described in U.S. Pat. Nos. 4,840,796 and 4,686,137, expressly incorporated herein by reference relative to these copolymers, have been known to form materials with good mechanical properties such as being elastomeric at room temperature. Desired properties of these silicone-urea/urethane copolymers can be optimized by varying a level of polydimethylsiloxane (PDMS), a type of chain extender used, and a type of isocyanate used. If included, the block copolymers are typically present in the curable composition of the tie layer 30 in an amount of from 1 to 100 parts by weight per 100 parts by weight of the curable composition of the tie layer 30.

The curable composition of the tie layer 30 may also include a curing inhibitor to improve handling conditions and storage properties. The curing inhibitor may be any known in the art and may include, but is not limited to, methyl-vinyl cyclics, acetylene-type compounds, such as 2-methyl-3-butyn-2-ol, 2-phenyl-3-butyn-2-ol, 3,5-dimethyl-1-hexyn-3-ol, 1-ethynyl-1-cyclohexanol, 1,5-hexadiene, 1,6-heptadiene, 3,5-dimethyl-1-hexen-1-yne, 3-ethyl-3-buten-1-yne and/or 3-phenyl-3-buten-1-yne, an alkenylsiloxane oligomer such as 1,3-divinyltetramethyldisiloxane, 1,3,5,7-tetravinyltetramethyl cyclotetrasiloxane, or 1,3-divinyl-1,3-diphenyldimethyldisiloxane, a silicone compound including an ethynyl group such as methyltris (3-methyl-1-butyn-3-oxy) silane, a nitrogen compound such as tributylamine, tetramethylethylenediamine, benzotriazole, a phosphorus compound such as triphenylphosphine, sulphur compounds, hydroperoxy compounds, maleic-acid derivatives thereof, and combinations thereof. Alternatively, the curing inhibitor may be selected from the curing inhibitors disclosed in U.S. Pat. Nos. 6,020,409 and 6,169,155, expressly incorporated herein by reference relative to the curing inhibitors. If included, the curing inhibitors are typically included in an amount of less than 3 parts by weight, more typically of from 0.001 to 3 parts by weight, and most typically of from 0.01 to 1 part by weight, per 100 parts by weight of component (A).

Each of the components (A-E) may be pre-reacted (or tethered) together, also known in the art as bodying. In one embodiment, silanol functional polymers are tethered to silanol functional resins. This tethering typically involves condensation and re-organization and can be carried out using base or acid catalysis. Tethering can be further refined by the inclusion of reactive or non-reactive organo-silane species.

Still further, the curable composition of the tie layer 30 may include additives such as fillers, extending fillers, pigments, adhesion promoters, corrosion inhibitors, dyes, diluents, anti-soiling additives, and combinations thereof, which may be the same or different than those described in detail above. The curable composition of the tie layer 30 may be cured by any mechanism known in the art including, but not limited to, those described in detail above.

In one embodiment, the tie layer 30 is substantially free of silicone based resins. In another embodiment, the tie layer 30 is substantially free of thermoplastic resins. The terminology "substantially free" represents an amount of the silicone based resins and/or thermoplastic resins in the tie layer 30 of less than 1,000, more typically of less than 500, and most typically of less than 100, parts by weight per one million parts by weight of the curable composition of the tie layer 30. In a further embodiment, the tie layer 30 does not have suitable physical properties such that it could be classified as a hot melt composition, i.e., as an optionally curable thermoset product that is inherently high in strength and resistant to flow (i.e. high viscosity) at room temperature.

Referring back, the second (outermost) layer 26 typically has a dielectric strength of from 400 to 800 volts per mil. In one embodiment, the second (outermost) layer 26 has a dielectric strength of from 400 to 500 volts per mil. In another embodiment, the second (outermost) layer 26 has a dielectric strength of from 500 to 600 volts per mil. In a further embodiment, the second (outermost) layer 26 has a dielectric strength of from 600 to 700 volts per mil. In yet another embodiment, the second (outermost) layer 26 has a dielectric strength of from 700 to 800 volts per mil. The photovoltaic cell 24 and the second (outermost) layer 26 also typically have an adhesion strength of from 1 to 10 pounds per inch according to ASTM D903.

As described above, the module 20, by itself, includes the first outermost layer 22, the second (outermost) layer 26, and the photovoltaic cell 24, one example of which is set forth in FIG. 1. In one embodiment, the module 20 consists essentially of the first outermost layer 22, the photovoltaic cell 24, and the second (outermost) layer 26. In another embodiment the module 20 consists essentially of the first outermost layer 22, the photovoltaic cell 24, the second (outermost) layer 26, and the tie layer 30. In each of these aforementioned embodiments, the module 20 does not include any additional tie layers, substrates, or photovoltaic cells. In a further embodiment, as shown in FIGS. 3 and 10, the module 20 includes the first outermost layer 22, the tie layer 30 disposed on, and in direct contact with, the first outermost layer 22, the photovoltaic cell 24 disposed on, and spaced apart from, the first outermost layer 22, and the second (outermost) layer 26 disposed on, and in direct contact with, the photovoltaic cell 24.

Alternatively, the module 20 may consist of the first outermost layer 22, the photovoltaic cell 24, the second (outermost) layer 26, and the electrical leads or consist of the first outermost layer 22, the photovoltaic cell 24, the second (outermost) layer 26, the tie layer 30, and the electrical leads. It is also contemplated that the module 20 may be free of or include polyethylene terephthalate, polyethylene naphthalate, polyvinyl fluoride, and/or ethylene vinyl acetate. The module 20 may be totally free of all polymers except for silicone polymers. Alternatively, the module 20 may be free of any layers that include polyethylene terephthalate, polyethylene naphthalate, polyvinyl fluoride, and/or ethylene vinyl acetate. In one embodiment, the module 20 is free of Tedlar®.

Figure 9:
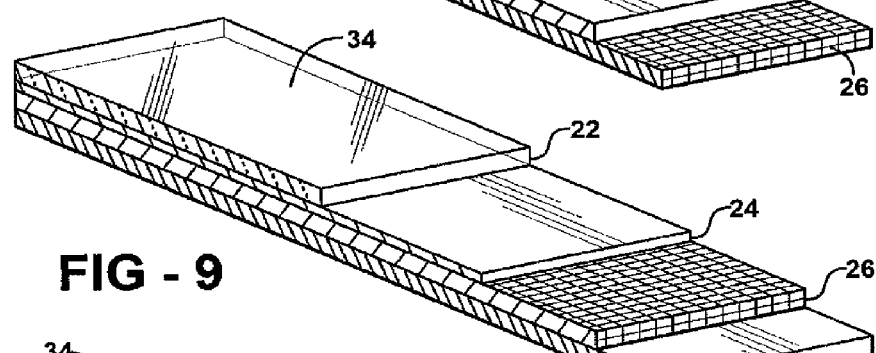
FIG. 9 is a side cross-sectional view of a photovoltaic cell module formed from the method of this invention and including a first outermost layer, a photovoltaic cell disposed on the first outermost layer, a second layer disposed on the photovoltaic cell, and a supporting layer disposed on the second layer as a second outermost layer wherein the second layer is free of a plurality of fibers and is formed from a hydrosilylation-curable silicone composition.
Figure 11:
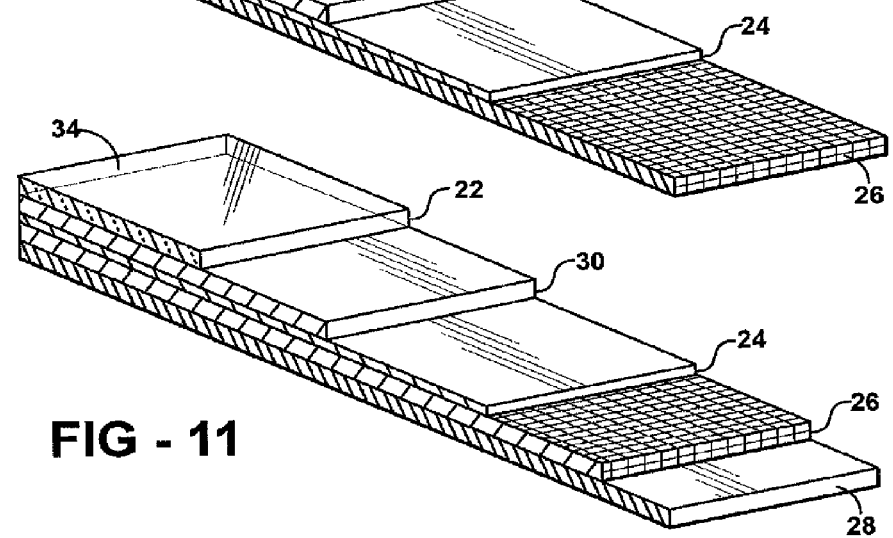
FIG. 11 is a side cross-sectional view of a photovoltaic cell module formed from the method of this invention including a first outermost layer, a tie layer disposed on, and in direct contact with, the first outermost layer, a photovoltaic cell disposed on, and spaced apart from, the first outermost layer, a second layer disposed on the photovoltaic cell, and a supporting layer disposed on, and in direct contact with, the second layer as a second outermost layer wherein the second layer is free of a plurality of fibers and is formed from a hydrosilylation-curable silicone composition.

Relative to the method of this invention, each of the first outermost layer 22, the photovoltaic cell 24, the second (outermost) layer 26, the tie layer 30, and/or the supporting layer 28 may be present in the module 20 in any order so long as the photovoltaic cell 24 is disposed on the first outermost layer 22 and the second (outermost) layer 26 is disposed on the photovoltaic cell 24. In one embodiment, as specifically related to the method of this invention, and as shown in FIGS. 2 and 9, the module 20 includes the first outermost layer 22, the photovoltaic cell 24 disposed on the first outermost layer 22, the second (outermost) layer 26 disposed on the photovoltaic cell 24, and the supporting layer 28 disposed on the tie layer 26. In another embodiment, as specifically related to the instant method, and as shown in FIGS. 4 and 11, the module 20 includes the first outermost layer 22, the tie layer 30 disposed on, and in direct contact with, the first outermost layer 22, the photovoltaic cell 24 disposed on, and spaced apart from, the first outermost layer 22, the second (outermost) layer 26 disposed on, and in direct contact with, the photovoltaic cell 24, and the supporting layer 28 disposed on, and in direct contact with, the second layer 26. Additionally, the module 20 may include a protective seal (not shown in the Figures) disposed along each edge of the module 20 to cover the edges. The module 20 may also be partially or totally enclosed within a perimeter frame that typically includes aluminum and/or plastic (also not shown in the Figures).

The instant invention also provides a photovoltaic array 32, as shown in FIG. 6A. The photovoltaic array 32 includes at least two modules 20. Typically the modules 20 are electrically connected, as described above, to provide suitable voltage. The photovoltaic array 32 may be of any size and shape and may be utilized in any industry. More specifically, in FIG. 6A, the photovoltaic array 32 includes a series of modules 20 of the type shown in FIG. 1 that are electrically connected together.

The present invention also provides a method of forming the module 20. Relative to the method, the module 20 is not limited to the second layer 26 being a second "outermost" layer. The module 20 of the method may include the first outermost layer 22, the photovoltaic cell 24, and the second (outermost) layer 26. However, the module 20 of the method may include the supporting layer 28 as the second outermost layer while the second layer 26 is an interior layer and not an outermost layer. In addition, the silicone composition used in the method is a liquid silicone composition.

The method includes the steps of disposing the photovoltaic cell 24 on the first outermost layer 22, disposing the liquid silicone composition on the photovoltaic cell 24, and at least partially coating the plurality of fibers 27 with the liquid silicone composition to form the second (outermost) layer 26. The method also includes the step of compressing the first outermost layer 22, the photovoltaic cell 24, and the second (outermost) layer 26 to form the module 20.

In one embodiment, the plurality of fibers 27 is at least partially coated prior to the step of disposing the liquid silicone composition on the photovoltaic cell 24. In this embodiment, the plurality of fibers 27 may be at least partially coated with the liquid silicone composition separately from the module 22, i.e., the second (outermost) layer 26 may be a preformed sheet. In another embodiment, the plurality of fibers 27 is at least partially coated after the step of disposing the liquid silicone composition on the photovoltaic cell 24. That is, the liquid silicone composition may be disposed on the photovoltaic cell 24 and then the plurality of fibers 27 may be disposed (e.g. placed) in the liquid silicone composition to at least partially coat the fibers 27. Alternatively, the plurality of fibers 27 may be disposed on the photovoltaic cell 24 and then the liquid silicone composition may be applied to the plurality of fibers 27 on the photovoltaic cell 24. Further, the plurality of fibers 27 may be at least partially coated simultaneously with the step of disposing the liquid silicone composition on the photovoltaic cell 24. In other words, the plurality of fibers 27 may be disposed on the photovoltaic cell 24 at the same time and in the same space as the plurality of fibers 27 is disposed on the photovoltaic cell 24.

The photovoltaic cell 24 can be disposed (e.g. applied) by any suitable mechanism known in the art but is typically disposed using an applicator in a continuous mode. In one embodiment, the photovoltaic cell 24 is disposed on the first outermost layer 22 via chemical vapor deposition or physical sputtering. Other suitable mechanisms of disposing the photovoltaic cell 24 on the first outermost layer 22 include applying a force to the photovoltaic cell 24 to more completely contact the photovoltaic cell 24 and the first outermost layer 22.

Referring to the step of disposing the liquid silicone composition on the photovoltaic cell 24, this step may also include any suitable application method known in the art including, but not limited to, spray coating, flow coating, curtain coating, dip coating, extrusion coating, knife coating, screen coating, laminating, melting, pouring, brushing, and combinations thereof.

As first introduced above, the method also includes the step of at least partially coating the plurality of fibers 27 with the liquid silicone composition. The step of at least partially coating may be accomplished by any means known in the art including, but not limited to, spray coating, flow coating, curtain coating, dip coating, extrusion coating, knife coating, screen coating, laminating, melting, pouring, brushing, and combinations thereof. In one embodiment, the plurality of fibers 27 is at least partially coated by placing the plurality of fibers 27 in an amount of the liquid silicone composition. In a further embodiment, the plurality of fibers 27 can be at least partially coated as part of the module 20.

In another embodiment, the silicone composition is supplied to a user as a multi-part system including a first and a second part. The first and second parts may be mixed immediately prior to at least partially coating the plurality of fibers 27 and/or immediately prior to disposing the liquid silicone composition on the photovoltaic cell 24. In a further embodiment, the method further includes the step of partially curing, e.g. "pre-curing," the liquid silicone composition and/or curable composition to form the second (outermost) layer 26 and/or the tie layer 30, respectively. Additionally, the method may include the step of curing the liquid silicone composition and/or the curable composition to form the second (outermost) layer 26 and/or the tie layer 30, respectively. Additionally, the step of at least partially coating the plurality of fibers 27 may be further defined as encapsulating all or a part of the plurality of fibers 27. In one embodiment, the step of at least partially coating the plurality of fibers 27 may be further defined as encapsulating at least part of the photovoltaic cell 24.

In an additional embodiment, the method may include the step of treating the first outermost layer 22, the photovoltaic cell 24, the tie layer 26, the supporting layer 28, and/or the tie layer 30, with a plasma, as described in U.S. Pat. No. 6,793,759, incorporated herein by reference.

Referring now to the step of compressing, it is to be understood that even after the step of compressing, the photovoltaic cell 24 and the first outermost layer 22 do not need to be in direct contact. The step of compressing may be further defined as applying a vacuum to the photovoltaic cell 24 and the first outermost layer 22. Alternatively, a mechanical weight, press, or roller (e.g. a pinch roller) may be used for compression. The plurality of fibers 27 extending laterally across the second (outermost) layer 26 to the periphery 36 of the module 20 resists leakage of the liquid silicone composition from the module 20 during the step of compressing.

Further, the step of compressing may be further defined as laminating. Still further, the method may include the step of applying heat to the module 20. Heat may be applied in combination with any other step or may be applied in a discrete step. The entire method may be continuous or batch-wise or may include a combination of continuous and batch-wise steps.

Examples

Formation of Modules

Two modules (Modules A and B) are formed according to the method of instant invention. In addition, four comparative modules (Comparative Modules A-D) are also formed but not according to the method of the instant invention. In the Modules A and B, a plurality of fibers extends laterally across a second layer to a periphery of the Modules on both ends of the Modules.

More specifically, Module A includes:

A 156 mm×156 mm×3.2 mm first outermost layer (glass) having a light transmittance of at least 70 percent as determined by UV/Vis spectrophotometry using ASTM E424-71;

A 156 mm×156 mm×200 μm photovoltaic cell disposed on the first outermost layer;

A 5-mil second layer uniformly disposed on and across the photovoltaic cell and including a textile (non-woven fiberglass) as the plurality of fibers that is at least partially coated with a first liquid silicone composition; and A 156 mm×156 mm×125 μm supporting layer (Tedlar®) disposed on the second layer.

Module B includes:

A 156 mm×156 mm×3.2 mm first outermost layer (glass) having a light transmittance of at least 70 percent as determined by UV/Vis spectrophotometry using ASTM E424-71;

A 156 mm×156 mm×200 µm contact photovoltaic cell disposed on the first outermost layer; and A 15-mil second layer uniformly disposed on and across the photovoltaic cell and including a textile (non-woven polyester) as the plurality of fibers that is at least partially coated with a second liquid silicone composition. Module B does not include a supporting layer.

Comparative Module A includes:

A 156 mm×156 mm×3.2 mm first outermost layer (glass) having a light transmittance of at least 70 percent as determined by UV/Vis spectrophotometry using ASTM E424-71;

A 156 mm×156 mm×200 µm photovoltaic cell disposed on the first outermost layer;

A 15-mil second layer uniformly disposed on and across the photovoltaic cell and including the liquid silicone composition of Module 1; and A 156 mm×156 mm×125 µm supporting layer (Tedlar®) disposed on the tie layer. Comparative Module A does not include a plurality of fibers.

Comparative Module B includes:

A 156 mm×156 mm×3.2 mm first outermost layer (glass) having a light transmittance of at least 70 percent as determined by UV/Vis spectrophotometry using ASTM E424-71;

A 156 mm×156 mm×200 µm photovoltaic cell disposed on the first outermost layer; and A 15-mil second layer uniformly disposed on and across the photovoltaic cell and including the liquid silicone composition of Module B. Comparative Module B does not include a plurality of fibers or a supporting layer.

Comparative Module C includes:

A 156 mm×156 mm×3.2 mm first outermost layer (glass) having a light transmittance of at least 70 percent as determined by UV/Vis spectrophotometry using ASTM E424-71;

A 156 mm×156 mm×200 µm contact photovoltaic cell disposed on the first outermost layer;

A 15-mil second layer uniformly disposed on and across the photovoltaic cell and including a textile (non-woven fiberglass) as the plurality of fibers that is at least partially coated with ethylene vinyl acetate polymer; and A 156 mm×156 mm×125 µm supporting layer (Tedlar®) disposed on the tie layer. Comparative Module C does not include silicone.

Comparative Module D includes:

A 156 mm×156 mm×3.2 mm first outermost layer (glass) having a light transmittance of at least 70 percent as determined by UV/Vis spectrophotometry using ASTM E424-71;

A 156 mm×156 mm×200 µm photovoltaic cell disposed on the first outermost layer; and A 15-mil second layer uniformly disposed on and across the photovoltaic cell and including a textile (non-woven polyester) as the plurality of fibers that is at least partially coated with an ethylene vinyl acetate polymer. Comparative Module D does not include silicone or a supporting layer.

The glass is commercially available from AFG Industries, Inc. under the trade name Solatex® 2000. The non-woven fiberglass is commercially available from Crane Nonwovens of Dalton, Mass. The non-woven polyester is also commercially available from Crane Nonwovens of Dalton, Mass. The photovoltaic cells are commercially available from Trina Solar and BP Solar. The Tedlar® is commercially available from DuPont. The ethylene vinyl acetate polymer is also commercially available from DuPont. The first and second liquid silicone compositions are set forth in Table 1 below wherein all parts are in parts by weight, unless otherwise indicated. After formation, the Modules 1 and 2 and the Comparative Modules 1-4 are visually evaluated to determine a presence of Void Spaces in the second layer. The results of these evaluations are also set forth in Table 1 below.

TABLE 1

| Formulation | Mod. A | Mod. B | Comp. Mod. A | Comp. Mod. B | Comp. Mod. C | Comp. Mod. D |
|---|---|---|---|---|---|---|
| First/Second Silicone Compositions | Yes | Yes | Yes | Yes | — | — |
| Polymer 1 | 88.31 | 47.10 | 88.31 | 47.10 | — | — |
| Polymer 2 | 8.96 | 4.61 | 8.96 | 4.61 | — | — |
| Polymer 3 | 0.60 | 0.74 | 0.60 | 0.74 | — | — |
| Adhesion Promoter 1 | 1.01 | 0.98 | 1.01 | 0.98 | — | — |
| Adhesion Promoter 2 | 1.01 | 0.98 | 1.01 | 0.98 | — | — |
| Catalyst | 0.06 | 0.25 | 0.06 | 0.25 | — | — |
| Cure Inhibitor | 0.06 | 0.01 | 0.06 | 0.01 | — | — |
| Filler | — | 45.33 | — | 45.33 | — | — |
| Total | ~100 | ~100 | ~100 | ~100 | — | — |
| SiH: SiVi Ratio | 0.95 | 1.05 | 0.95 | 1.05 | — | — |
| Weight Ratio of Polymer 2: Polymer 3 | 15.00 | 6.27 | 15.00 | 6.27 | — | — |
| Amount of Platinum from Catalyst (ppm) | 5.05 | 12.76 | 5.05 | 12.76 | — | — |
| Ethylene Vinyl Acetate (EVA) Polymer | — | — | — | — | Yes | Yes |
| Non-Woven Fiberglass | Yes | — | — | — | Yes | — |
| Non-Woven Polyester | — | Yes | — | — | — | Yes |
| Tedlar ® | Yes | — | Yes | — | Yes | — |
| Thickness of Silicone/EVA (mils) | 5 | 15 | 15 | 15 | 9 | 15 |
| Void Spaces | No | No | No | Yes | No | No |

Polymer 1 is a vinyldimethylsilyl end-blocked polydimethylsiloxane having a viscosity of 450 mPa·s at 25° C. and including 0.46 weight percent Si-Vinyl bonds.

Polymer 2 is a dimethylhydrogensilyl terminated polydimethylsiloxane that has a viscosity of 10 mPa·s and 0.16 weight percent of Si—H bonds.

Polymer 3 is a trimethylsilyl terminated polydimethylsiloxane-methylhydrogensiloxane co-polymer having a viscosity of 5 mPa·s and including 0.76 weight percent of Si—H bonds.

Adhesion Promoter 1 is a reaction product of trimethylsilyl- and dimethylvinylsilyl-treated silica and an organofunctional silane and has a viscosity of 25 mPa·s.

Adhesion Promoter 2 is a reaction product of trimethylsilyl- and dimethylvinylsilyl-treated silica and an epoxy functional silane and has a viscosity of 25 mPa·s.

Catalyst is a platinum catalyst including platinum complexes of 1,3-diethenyl-1,1,3,3-tetramethyldisiloxane.

Cure Inhibitor is methylvinylcyclosiloxane having a viscosity of 3 mPa·s. with an average DP of 4, an average weight average molecular weight of 344 g/mol, and 31.4 weight percent of Si-Vinyl bonds.

Filler is a quartz filler having an average particle size of 5 µm.

As set forth in Table 1 above, Modules A and B of the instant invention can be formed with less material, i.e., less silicone, as demonstrated through the decreased thickness of the silicone in the tie layer of Module A. This reduces production times, costs, and complexities. The Modules A and B also do not include Void Spaces. This increases structural strength and stability of the Modules. As described above, the Modules A and B are formed by the method of this invention wherein the plurality of fibers extends laterally across the second layer to a periphery of the Modules on both ends of the Modules to resist leakage of the liquid silicone composition from the Modules during the step of compressing.

Formation of Additional Layers:

Additional layers (Layers A-E) are also formed and are evaluated to determine Dielectric Strength (volts/mil) and Corrected Dielectric Strength (volts/mil). The Layers A-E are formed and evaluated apart from any first outermost layer and any photovoltaic cells. Layer A includes only ethylene vinyl acetate, does not include a plurality of fibers, and does not represent a tie layer of the instant invention. Layer B includes only a silicone composition, does not include a plurality of fibers, and does not represent the second (outermost) layer of the instant invention. Layer C represents one possible second (outermost) layer of the instant invention, includes the silicone composition of Layer B, and includes a plurality of polyester fibers at least partially coated with the silicone composition. More specifically, Layer C includes a layer of non-woven polyester fibers that is 4 mils thick. Layer D represents another possible second (outermost) layer of the instant invention, includes the silicone composition of Layer B, and includes a plurality of fiberglass fibers at least partially coated with the silicone composition. More specifically, Layer D includes a layer of non-woven fiberglass fibers that is 4 mils thick. Layer E represents yet another possible second (outermost) layer of the instant invention, includes the silicone composition of Layer B, and includes a plurality of fiberglass fibers at least partially coated with the silicone composition. More specifically, Layer E includes two layers of non-woven fiberglass fibers that are 4 and 5 mils thick, respectively. The Layers A-E and the results of the evaluations of Dielectric Strength and Corrected Dielectric Strength are set forth in Table 2 below.

TABLE 2

|  | Layer A | Layer B | Layer C | Layer D | Layer E |
|---|---|---|---|---|---|
| Silicone Composition | No | Yes | Yes | Yes | Yes |
| Polymer 1 | — | 90.81 | 90.81 | 90.81 | 90.81 |
| Polymer 2 | — | 8.5 | 8.5 | 8.5 | 8.5 |
| Polymer 3 | — | 0.57 | 0.57 | 0.57 | 0.5b7 |

TABLE 2-continued

|  | Layer A | Layer B | Layer C | Layer D | Layer E |
|---|---|---|---|---|---|
| Catalyst | — | 0.06 | 0.06 | 0.06 | 0.06 |
| Cure Inhibitor | — | 0.06 | 0.06 | 0.06 | 0.06 |
| Total | — | 100 | 100 | 100 | 100 |
| SiH:SiVi Ratio | — | 1.1 | 1.1 | 1.1 | 1.1 |
| Pt Content (ppm) | — | 4.9 | 4.9 | 4.9 | 4.9 |
| Ethylene Vinyl Acetate (EVA) Polymer | Yes | No | No | No | No |
| Non-Woven Fiberglass (4 mils) | No | No | No | Yes | Yes (2 Layers; 4 + 5 mil) |
| Non-Woven Polyester (4 mils) | No | No | Yes | No | No |
| Thickness of Silicone + (Non-Woven or EVA) (mils) | 17 | 21 | 19 | 19 | 20 |
| Dielectric Strength (Volts/mil) | 907 | 720 | 752 | 737 | 790 |
| Corrected Dielectric Strength (17 mil) (Volts/mil) | 907 | 795 | No Data | No Data | No Data |

In Table 2, the Polymers 1-3, the Catalyst, and the Cure Inhibitor are the same as those set forth in Table 1. The data set forth above suggests that the Layers of this invention perform as well or better than comparative layers that are not of this invention. The data also suggests that the plurality of fibers and the silicone composition of this invention allow for cost effective and repeatable production of photovoltaic cell modules because of controlled diffusion of the silicone composition, minimization of the amount of silicone composition used through resistance to leakage of the silicone composition from the Modules during the step of compressing, minimized waste, and increased consistency of thickness and size of the module. The plurality of fibers and the silicone composition also allow for formation of a module without a supporting layer thereby reducing costs, production complexities, and time needed to form the module.

Formation of Hydrosilylation-Curable Silicone Compositions:

A series of hydrosilylation-curable silicone compositions (Compositions 1-10) are also formed according to this invention, as set forth in Table 3 below. After formation, the Compositions 1-10 are heated at about 125° C. for a time of from 15 to 20 minutes to cure and to form three groups of corresponding layers (Layers 1-10) that represent various embodiments of the second (outermost) layer of this invention. The Layers 1-10 are evaluated for various physical properties, as further described below.

TABLE 3

|  | Composition 1 | Composition 2 | Composition 3 | Composition 4 |
|---|---|---|---|---|
| Branched Organosilicon Compound | — | — | — | 3.93 |
| Linear Organosilicon Compound 1 | 90.8 | 35.1 | 43.15 | — |
| Linear Organosilicon Compound 2 | — | — | — | 92.35 |
| Linear Organosilicon Compound 3 | — | — | 5.68 | — |
| Organohydrogensilicon Compound 1 (chain-extender) | 8.5 | — | 4.9 | — |

TABLE 3-continued

|  | | | | |
| --- | --- | --- | --- | --- |
| Organohydrogensilicon Compound 2 (cross-linker) | 0.57 | 1.44 | 0.61 | 3.62 |
| Inhibitor | 0.07 | 0.19 | 0.025 | 0.03 |
| Catalyst 1 | — | 0.09 | — | — |
| Catalyst 2 | 0.06 | — | 0.065 | 0.07 |
| Filler | — | 55.38 | 44.55 | — |
| Pigment | — | 7.57 | — | — |
| Adhesion Promoter 1 | — | — | 1.01 | — |
| Adhesion Promoter 2 | — | 0.226 | — | — |
| Total Wt % | 100.00 | 100.00 | 99.99 | 100.00 |
| SiH/SiVi Ratio | 1.1 | 1.12 | 1.04 | 1.49 |
| Ratio of Chain-Extender to Cross-Linker | 15 | N/A | 8 | N/A |
| Pt Concentration (ppm) | 4.9 | 5.4 | 5.7 | 6.0 |

|  | Composition 5 | Composition 6 | Composition 7 | Composition 8 |
| --- | --- | --- | --- | --- |
| Branched Organosilicon Compound | 6.74 | 9.33 | 13.19 | 9.29 |
| Linear Organosilicon Compound 1 | — | — | — | — |
| Linear Organosilicon Compound 2 | 88.01 | 84.03 | 78.18 | 74.09 |
| Linear Organosilicon Compound 3 | — | — | — | 10.01 |
| Organohydrogensilicon Compound 1 (chain-extender) | — | — | — | — |
| Organohydrogensilicon Compound 2 (cross-linker) | 5.16 | 6.54 | 8.53 | 6.51 |
| Inhibitor | 0.03 | 0.04 | 0.03 | 0.03 |
| Catalyst 1 | — | — | — | — |
| Catalyst 2 | 0.07 | 0.07 | 0.07 | 0.07 |
| Filler | — | — | — | — |
| Pigment | — | — | — | — |
| Adhesion Promoter 1 | — | — | — | — |
| Adhesion Promoter 2 | — | — | — | — |
| Total Wt % | 100.01 | 100.01 | 100.00 | 100.00 |
| SiH/SiVi Ratio | 1.51 | 1.51 | 1.50 | 1.53 |
| Ratio of Chain-Extender to Cross-Linker | N/A | N/A | N/A | N/A |
| Pt Concentration (ppm) | 6.0 | 5.8 | 6.0 | 5.7 |

|  | Composition 9 | Composition 10 |
| --- | --- | --- |
| Branched Organosilicon Compound | 4.68 | 4.67 |
| Linear Organosilicon Compound 1 | — | — |
| Linear Organosilicon Compound 2 | 42.11 | 37.22 |
| Linear Organosilicon Compound 3 | — | 5.03 |
| Organohydrogensilicon Compound 1 (chain-extender) | — | — |
| Organohydrogensilicon Compound 2 (cross-linker) | 3.32 | 3.32 |
| Inhibitor | 0.01 | 0.03 |
| Catalyst 1 | — | — |
| Catalyst 2 | 0.07 | 0.06 |
| Filler | 49.81 | 49.67 |
| Pigment | — | — |
| Adhesion Promoter 1 | — | — |
| Adhesion Promoter 2 | — | — |
| Total Wt % | 100.00 | 100.00 |
| SiH/SiVi Ratio | 1.54 | 1.54 |
| Ratio of Chain-Extender to Cross-Linker | N/A | N/A |
| Pt Concentration (ppm) | 5.72 | 5.72 |

Branched Organosilicon Compound is a polydimethylsiloxane that includes two terminal unsaturated (i.e., vinyl) moieties per molecule and at least one pendant unsaturated (i.e., vinyl) moiety per molecule, has a average degree of polymerization of about 620, a weight average molecular weight of about 46,000 g/mol, a viscosity of about 15,000 cps at 25° C. determined according to ASTM D4287, and a weight percent of vinyl groups of about 7.7%.

Linear Organosilicon Compound 1 is a polydimethylsiloxane that includes two terminal unsaturated (i.e., vinyl) moieties per molecule, has a average degree of polymerization of about 297, a weight average molecular weight of about 22,000 g/mol, a viscosity of about 2,100 cps at 25° C.

determined according to ASTM D4287, and a weight percent of vinyl groups of about 0.21%.

Linear Organosilicon Compound 2 is a polydimethylsiloxane that includes two terminal unsaturated (i.e., vinyl) moieties per molecule, has a average degree of polymerization of about 155, a weight average molecular weight of about 11,500 g/mol, a viscosity of about 450 cps at 25° C. determined according to ASTM D4287, and a weight percent of vinyl groups of about 0.46%.

Linear Organosilicon Compound 3 is a polydimethylsiloxane that includes two terminal unsaturated (i.e., vinyl) moieties per molecule, has a average degree of polymerization of about 837, a weight average molecular weight of about 62,000 g/mol, a viscosity of about 55,000 cps at 25° C. determined according to ASTM D4287, and a weight percent of vinyl groups of about 0.088%.

Organohydrogensilicon Compound 1 is a dimethylhydrogen terminated dimethyl siloxane chain extender, has a average degree of polymerization of about 12, a weight average molecular weight of about 894 g/mol, a viscosity of about 10 centistokes at 25° C. determined according to ASTM D4287, and a weight percent of Si—H groups of about 0.16%.

Organohydrogensilicon Compound 2 is a cross-linker that is a dimethyl, methylhydrogen siloxane that is trimethylsiloxy terminated. This cross-linker has a average degree of polymerization of about 10, a weight average molecular weight of about 684 g/mol, a viscosity of about 5 centistokes at 25° C. determined according to ASTM D4287, and a weight percent of Si—H groups of about 0.76%.

Inhibitor is methylvinylcyclosiloxane having a average degree of polymerization of about 4, a weight average molecular weight of about 344 g/mol, a viscosity of about 3 cps at 25° C. determined according to ASTM D4287, and a weight percent of vinyl groups of about 31.4%.

Catalyst 1 is a 1,3-diethenyl-1,1,3,3-tetramethyldisiloxane complex with platinum in a silicone fluid that has a weight percent of vinyl groups of about 1.97%.

Catalyst 2 is a 1,3-diethenyl-1,1,3,3-tetramethyldisiloxane complex with platinum in a silicone fluid that has a weight percent of vinyl groups of about 0.86%.

Filler is a quartz filler having an average particle size of 5 μm, a median particle size is 1.8 μm, and greater than 97% of the filler has an average particle size of 5 μm.

Pigment includes acetylene black, ZnO, and a silicone fluid

Adhesion Promoter 1 is methacryloxypropyltrimethoxysilane.

Adhesion Promoter 2 is a reaction product of trimethylsilyl and dimethylvinylsilyl treated silica and an epoxy functional silane and has a viscosity of 25 mPa·s. determined according to ASTM D4287.

Formation of Layers from the Hydrosilylation-Curable Silicone Compositions:

Referring back to the Layers 1-10 first introduced above, the Layers 1-10 are formed in three groups. In a first group, Layers 1-10 are formed without any plurality of fibers. In a second group, Layers 1-10 are formed and at least partially coat a 15 mil thick sheet of non-woven fiberglass fibers. In a third group, Layers 1-10 are formed and at least partially coat a 15 mil thick sheet of non-woven polyester fibers. After formation, various samples of the Layers 1-10 from each of the three groups are evaluated to determine Viscosity, Hardness, Tensile Strength, Elongation, Cut Strength, Dielectric Strength, Breakdown Voltage, and Volume Resistivity. The results of the evaluations are set forth below in Table 4.

TABLE 4

|  | Layer 1 | Layer 2 | Layer 3 | Layer 4 |
|---|---|---|---|---|
| Mix Viscosity (cps) | 343 | 3750 | 5200 | 1566 |
| Shore 00 Hardness | 35 | 75 | 73 | — |
| Shore A Hardness | — | — | — | 21 |
| Tensile Strength (lb/in$^2$) | Not Tested | Not Tested | 296 | 154 |
| % Elongation | Not Tested | Not Tested | 166 | 161 |
| Cut Strength—Without Plurality of Fibers | Fail | Fail | Fail | Fail |
| Cut Strength—Including 15 mil Fiberglass | Pass*+ | Pass+ | Pass+ | Fail |
| Cut Strength—Including 15 mil Polyester | Not Tested | Pass+ | Pass+ | Pass+ |
| Dielectric Strength (volts/mil) |  |  |  |  |
| Without Plurality of Fibers | 720 | Not Tested | Not Tested | Not Tested |
| Thickness of Layer (mils) | 21 | Not Tested | Not Tested | Not Tested |
| Dielectric Strength (volts/mil) |  |  |  |  |
| Including 9 mil Fiberglass | 790 | Not Tested | Not Tested | Not Tested |
| Thickness of Layer (mils) | 20 | Not Tested | Not Tested | Not Tested |
| Breakdown Voltage (kV) |  |  |  |  |
| Without Plurality of Fibers | 15.1 at 21 mils | Not Tested | Not Tested | Not Tested |
| Including 15 mil Fiberglass | 15.8 at 20 mils | Not Tested | Not Tested | Not Tested |
| Volume Resistivity (ohm-cm) |  |  |  |  |
| Without Plurality of Fibers | Not Tested | Not Tested | Not Tested | Not Tested |
| Including 15 mil Fiberglass | Not Tested | Not Tested | Not Tested | Not Tested |

TABLE 4-continued

|  | Layer 5 | Layer 6 | Layer 7 | Layer 8 |
|---|---|---|---|---|
| Mix Viscosity (cps) | 1801 | 1768 | 1706 | 3006 |
| Shore 00 Hardness | — | — | — | — |
| Shore A Hardness | 23 | 27 | 32 | 28 |
| Tensile Strength (lb/in$^2$) | 282 | 345 | 426 | 459 |
| % Elongation | 181 | 155 | 118 | 203 |
| Cut Strength—Without Plurality of Fibers | Fail | Fail | Fail | Fail |
| Cut Strength—Including 15 mil Fiberglass | Pass$^+$ | Pass$^+$ | Pass$^{++}$ | Pass$^{++}$ |
| Cut Strength—Including 15 mil Polyester | Pass$^+$ | Pass$^+$ | Pass$^{++}$ | Pass$^+$ |
| Dielectric Strength (volts/mil) | | | | |
| Without Plurality of Fibers | Not Tested | 705 | Not Tested | Not Tested |
| Thickness of Layer (mils) | Not Tested | 23 | Not Tested | Not Tested |
| Dielectric Strength (volts/mil) | | | | |
| Including 15 mil Fiberglass | Not Tested | 643 | Not Tested | 802 |
| Thickness of Layer (mils) | Not Tested | 24 | Not Tested | 18 |
| Breakdown Voltage (kV) | | | | |
| Without Plurality of Fibers | Not Tested | 16.2 at 23 mils | Not Tested | Not Tested |
| Including 15 mil Fiberglass | Not Tested | 15.4 at 24 mils | Not Tested | 14.4 at 18 mils |
| Volume Resistivity (ohm-cm) | | | | |
| Without Plurality of Fibers | Not Tested | 1.23E+15 | Not Tested | 1.38E+15 |
| Including 15 mil Fiberglass | Not Tested | 1.50E+14 | Not Tested | 3.94E+14 |

|  | Layer 9 | Layer 10 |
|---|---|---|
| Mix Viscosity (cps) | 9700 | 13,400 |
| Shore 00 Hardness | — | — |
| Shore A Hardness | 70 | 66 |
| Tensile Strength (lb/in$^2$) | 733 | 708 |
| % Elongation | 72 | 110 |
| Cut Strength—Without Plurality of Fibers | Pass | Pass |
| Cut Strength—Including 15 mil Fiberglass | Pass$^{+++}$ | Pass$^{+++}$ |
| Cut Strength—Including 15 mil Polyester | Pass$^{+++}$ | Pass$^{+++}$ |
| Dielectric Strength (volts/mil) | | |
| Without Plurality of Fibers | 781 | 853 |
| Thickness of Layer (mils) | 25 | 20 |
| Dielectric Strength (volts/mil) | | |
| Including 15 mil Fiberglass | 753 | 855 |
| Thickness of Layer (mils) | 28 | 24 |
| Breakdown Voltage (kV) | | |
| Without Plurality of Fibers | 19.7 at 25 mils | 17.4 at 20 mils |
| Including 15 mil Fiberglass | 21 at 28 mils | 21 at 24 mils |
| Volume Resistivity (ohm-cm) | | |
| Without Plurality of Fibers | 1.82E+15 | 2.81E+15 |
| Including 15 mil Fiberglass | 2.45E+15 | 1.81E+15 |

*Indicates passage when 7 mil Tedlar backsheet applied to Layer 1
$^+$represents a qualitative visual evaluation of the Layers that indicates that no holes or perforations are present after the Cut-Test.
$^{++}$represents a qualitative visual evaluation of the Layers that is superior to the (+) above and indicates that there are no visual protruding marks present on a reverse side of the Layers from a side exposed to the Cut-Test.
$^{+++}$represents a qualitative visual evaluation of the Layers that is superior to the (+) and (++) above and indicates that there is very little visibility of any marks present on the side of the Layers exposed to the Cut-Test Mix Viscosity is determined at 25° C. determined according to ASTM D4287.

Shore 00 Hardness is determined using ASTM D 2240.

Shore A Hardness is determined using ASTM D 2240.

Tensile Strength (lb/in$^2$) is determined using ASTM D-412.

% Elongation is determined using ASTM D-412.

Cut Strength is determined using a Cut-Test. The Cut-Test is performed using UL-1703 and IEC 61730-2. A determination of "pass" is made based on visual evaluation of no holes or perforations in the Layers in addition to passage of a Wet-Leakage test described in greater detail below. Similarly, a determination of "fail" is made based on visual evaluation of one or more holes or perforations in the Layers and/or failure of the Wet-Leakage test.

Dielectric Strength (volts/mil) is determined using ASTM D 149

Breakdown Voltage (kV) (also known in the art as "Breakthrough Voltage") is calculated as Dielectric Strength (volts/mil)×sample thickness (mils).

Volume Resistivity (ohm-cm) is determined using ASTM D 257

The data set forth above suggest that the hydrosilylation-curable silicone compositions of the instant invention can generally be used to effectively form modules without Tedlar back sheets thus reducing costs, production complexities, and time needed to form photovoltaic modules. The data also suggests that use of a balance of linear organosilicon compounds and branched organosilicon compounds can also strengthen modules and can reduce a need to utilize expensive fillers and fibers. Moreover, the data suggests that use of the linear and branched organosilicon compounds along with fillers and/or fibers can provide additional strength for modules for use in specialized applications.

Formation of Modules:

The Compositions 1, 3, 6, 8, and 10 are also utilized to form a series of modules (Modules 1, 3, 6, 8, and 10). The Modules 1, 3, 6, 8, and 10 are each formed, top to bottom, as follows in Table 5:

TABLE 5

| Structure of Modules 1, 3, 6, 8, 10 | Identity | Dimensions |
|---|---|---|
| First Outermost Layer (22) | Glass having a light transmittance of at least 70 percent as determined by UV/Vis spectrophotometry using ASTM E424-71 | 204 mm × 204 mm × 125 mils |
| Tie Layer (30) | *Silicone | 204 mm × 204 mm × 15 mils |
| Photovoltaic Cell (24) | Multicrystalline Cell commercially available from Aleo Solar AG | 156 mm × 156 mm × 200 μm |
| Second Outermost Layer (26) | Compositions 1, 3, 6, 8, or 10 + 15 mil non-woven fiberglass sheet | 204 mm × 204 mm × 20 mils |
| Backsheet— Module 1 only | Tedlar ® | 204 mm × 204 mm × 7 mils |

*Silicone is further defined as a "front side" encapsulant and includes 52.77 parts by weight of Linear Organosilicon Compound 2, 10.75 parts by weight of Linear Organosilicon Compound 3, 32.39 grams of a trimethylsiloxy terminated dimethyl siloxane having a viscosity of about 100 centistokes at 25° C. determined according to ASTM D4287, 3.77 parts by weight of Organohydrogensilicon Compound 1, 0.24 parts by weight of Organohydrogensilicon Compound 2, 0.01 parts by weight of the Inhibitor, and 0.07 parts by weight of Catalyst 2. The front side encapsulant also has a mixed initial viscosity of about 668 cps at 25° C. determined according to ASTM D4287.

A Comparative Module is also formed, top to bottom, as follows in Table 6:

TABLE 6

| Structure of Comparative Module | Identity | Dimensions |
|---|---|---|
| First Outermost Layer (22) | Glass having a light transmittance of at least 70 percent as determined by UV/Vis spectrophotometry using ASTM E424-71 | 204 mm × 204 mm × 125 mils |
| Ethylene Vinyl Acetate Polymer | — | 204 mm × 204 mm × 17 mils |
| Photovoltaic Cell (24) | Multicrystalline Cell commercially available from Aleo Solar AG | 156 mm × 156 mm × 200 μm |
| Ethylene Vinyl Acetate Polymer | — | 204 mm × 204 mm × 17 mils |
| Tedlar ® | — | 204 mm × 204 mm × 7 mils |

The glass of the Modules 1, 3, 6, 8, and 10 and the Comparative Module is commercially available from AFG Industries, Inc. under the trade name Solatex® 2000. The fiberglass of the Modules 1, 3, 6, 8, and 10 is commercially available from Crane Nonwovens of Dalton, Mass. The photovoltaic cells of the Modules 1, 3, 6, 8, and 10 and the Comparative Module are commercially available from Trina Solar and BP Solar. The Tedlar® of the Module 1 and the Comparative Module is commercially available from DuPont. The ethylene vinyl acetate polymer of the Comparative Module is also commercially available from DuPont.

Damp-Heat Resistivity Testing of Modules:

After formation, samples of each of the Modules 1, 3, 6, 8, and 10 and the Comparative Module are evaluated per IEC 61215 Section 10.13, 1000 Hr Damp heat Test, to determine an effect of damp heat on resistivity (MOhm) after exposure to an environment at approximately 85° C. and 85% relative humidity (85/85) for varying periods of time. Once completed, a Wet-Leakage test is performed according to IEC 61215 Section 10.15. More specifically, samples of each of the Modules 1, 3, 6, 8, and 10 and the Comparative Module are exposed to the 85/85 environment both before and after being subjected to the Cut-Test, as described above. Subsequently, the samples are then evaluated to determine resistivity.

A first set of each of the Modules 1, 3, 6, 8, and 10 and the Comparative Module are placed in the 85/85 environment for approximately 1152 hours, then subsequently subjected to the Cut-Test. After the Cut-Test, the first set of Modules is submerged in 22.8° C. water for 2 minutes and evaluated to determine resistivity per the Wet-Leakage test, as set forth below in Table 7.

After the 2 minutes of submersion, the same first set of Modules remains submerged for an additional 2 minutes (total of 4 minutes submersion). After 4 total minutes of submersion, the first set of Modules is again evaluated to determine resistivity, also set forth below in Table 7.

In each of the following tests, summarized in Tables 7-10 below, the Modules 1, 3, 6, 8, and 10 and the Comparative Module are deemed to "pass" if the average resistivity is greater than 400 MOhms after being submerged for varying times and undergoing the Cut-Test. In other words, if the Average of 2 and 4 Minute Data is greater than 400 MOhms, the Modules "pass." If less than 400 MOhms, the Modules "fail."

TABLE 7

| | MOhm 2 Min First Set (1152 hr) | MOhm 4 Min First Set (1152 hr) | Average of 2 and 4 Minute Data First Set (1152 hr) | Pass/Fail |
|---|---|---|---|---|
| First Set Module 1 | 1000 | 1000 | 1000 | Pass |
| First Set Module 3 | 1000 | 1000 | 1000 | Pass |
| First Set Module 6 | 1000 | 782 | 891 | Pass |
| First Set Module 8 | 1000 | 871 | 935 | Pass |
| First Set Module 10 | 1000 | 1000 | 1000 | Pass |
| First Set Comparative Module | 1000 | 1000 | 1000 | Pass |

Additionally, after the submersion for 2 and 4 minutes described above, the first set of Modules is placed back in the 85/85 environment for an additional time of about 1635 hours such that the total time of exposure for the first set of Modules is approximately 2787 hours. After exposure to the 85/85 environment, the first set of Modules is submerged in 22.8° C. water for 2 minutes and evaluated to determine resistivity, as set forth below in Table 8.

After the 2 minutes of submersion, the same first set of Modules (after exposure to the 85/85 environment for a total of approximately 2787 hours) remains submerged for an additional 2 minutes (total of 4 minutes submersion). After 4 total minutes of submersion, the first set of Modules is again evaluated to determine resistivity, also set forth below in Table 8.

TABLE 8

| | MOhm 2 Min First Set (2787 hr) | MOhm 4 Min First Set (2787 hr) | Average of 2 and 4 Minute Data First Set (2787 hr) | Pass/Fail |
|---|---|---|---|---|
| First Set Module 1 | 73 | 63 | 68* | Fail** |
| First Set Module 3 | 1000 | 1000 | 1000 | Pass |
| First Set Module 6 | 767 | 502 | 634 | Pass |
| First Set Module 8 | 936 | 463 | 699 | Pass |
| First Set Module 10 | 1000 | 1000 | 1000 | Pass |
| First Set Comparative Module | 1000 | 1000 | 1000 | Pass |

*Indicates that the First Set of Module 1 tested at 2,376 hours of exposure to the 85/85 environment failed since a measurement of greater than 400 MOhms is required to pass.
**Indicates that at 1,968 hours, the sample passes with 831 MOhm average.

A second set of each of the Modules 1, 3, 6, 8, and 10 and the Comparative Module are also prepared and then subsequently subjected to the Cut-Test. After the Cut-Test, the second set of Modules is placed in the 85/85 environment for approximately 1152 hours. Subsequently, the second set of Modules is submerged in 22.8° C. water for 2 minutes and evaluated to determine resistivity, as set forth below in Table 9.

After the 2 minutes of submersion, the same second set of Modules remains submerged for an additional 2 minutes (total of 4 minutes submersion). After 4 total minutes of submersion, the second set of Modules is again evaluated to determine resistivity, also set forth below in Table 9.

TABLE 9

| | MOhm 2 Min Second Set (1152 hr) | MOhm 4 Min Second Set (1152 hr) | Average of 2 and 4 Minute Data Second Set (1152 hr) | Pass/Fail |
|---|---|---|---|---|
| Second Set Module 1 | 991 | 968 | 980 | Pass |
| Second Module 3 | 1000 | 1000 | 1000 | Pass |
| Second Module 6 | 470 | 378 | 424 | Pass |
| Second Module 8 | 1000 | 609 | 804 | Pass |
| Second Module 10 | 1000 | 1000 | 1000 | Pass |
| Second Comparative Module | 1000 | 1000 | 1000 | Pass |

Additionally, after the submersion for 2 and 4 minutes described above, the second set of Modules is placed back in the 85/85 environment for an additional time of about 1536 hours such that the total time of exposure for the first set of Modules is approximately 2688 hours. After exposure to the 85/85 environment, the second set of Modules is submerged in 22.8° C. water for 2 minutes and evaluated to determine resistivity, as set forth below in Table 10.

After the 2 minutes of submersion, the same second set of Modules (after exposure to the 85/85 environment for a total of approximately 2688 hours) remains submerged for an additional 2 minutes (total of 4 minutes submersion). After 4 total minutes of submersion, the second set of Modules is again evaluated to determine resistivity, also set forth below in Table 10.

TABLE 10

| | MOhm 2 Min Second Set (2688 hr) | MOhm 4 Min Second Set (2688 hr) | Average of 2 and 4 Minute Data Second Set (2688 hr) | Pass/Fail |
|---|---|---|---|---|
| Second Set Module 1 | 35 | 30 | 32* | Fail** |
| Second Module 3 | 1000 | 1000 | 1000 | Pass |
| Second Module 6 | 726 | 370 | 548 | Pass |
| Second Module 8 | 586 | 426 | 506 | Pass |
| Second Module 10 | 1000 | 1000 | 1000 | Pass |
| Second Comparative Module | 945 | 1000 | 973 | Pass |

*Indicates that the Second Set of Module 1 tested at 2,376 hours of exposure to the 85/85 environment failed since a measurement of greater than 400 MOhms is required to pass.
**Indicates that at 1,968 hours, the sample passes with 649 MOhm average.

The data set forth above suggests that the Modules 1, 3, 6, 8, and 10 of this invention generally perform as well as the Comparative Module which is not of this invention. Accordingly, since the Modules 3, 6, 8, and 10 can be formed without Tedlar, this invention reduces costs, production complexities, and time needed to form photovoltaic modules.

The invention has been described in an illustrative manner, and it is to be understood that the terminology which has been used is intended to be in the nature of words of description rather than of limitation. Many modifications and variations of the present invention are possible in light of the above teachings, and the invention may be practiced otherwise than as specifically described.

What is claimed is:
1. A photovoltaic array comprising:
A. a first outermost layer that is a single layer having a light transmittance of at least 70 percent as determined by UV/Vis spectrophotometry using ASTM E424-71 and that is silicone;
B. two or more photovoltaic cells electrically connected to each other, each disposed on said first outermost layer; and
C. a second outermost layer that is a single layer disposed opposite said first outermost layer, said second outermost layer comprising a (I) silicone composition and disposed on and in direct contact with said photovoltaic cells sandwiching said photovoltaic cells between said second outermost layer and said first outermost layer,
wherein said (I) silicone composition comprises a linear organosilicon compound having two terminal unsaturated moieties per molecule and present in an amount of from 80 to 95 parts by weight, a branched organosilicon compound having two terminal unsaturated moieties per molecule and at least one pendant unsaturated moiety per molecule and present in an amount of from 5 to 20 as parts by weight, per 100 parts by weight of a sum of said linear organosilicon compound and said branched organosilicon compound, and an organohydrogensilicon compound having at least three silicon-bonded hydrogen atoms per molecule wherein a ratio of silicon-bonded hydrogen atoms per molecule of said organohydrogensilicon compound to a sum of unsaturated moieties per molecule of said linear organosilicon compound and branched organosilicon compound is from 1 to 1.7,
wherein said first outermost layer is positioned on the top of said array and said array is free of any additional layers disposed on the top of said array, and wherein said second outermost layer is positioned on the bottom of said array and said array is free of any additional layers disposed on the bottom of said array.

2. The photovoltaic array of claim 1 that is free of any layers that include polyethylene terephthalate, polyethylene naphthalate, polyvinyl fluoride, and ethylene vinyl acetate.

3. The photovoltaic array of claim 1 that is free of any layers that include a polymer other than silicone polymers.

4. The photovoltaic array of claim 1 wherein said (I) silicone composition is at least partially cured.

5. The photovoltaic array of claim 1 wherein said (I) silicone composition further comprises a filler.

6. The photovoltaic array of claim 5 wherein said filler is a flame retardant.

7. The photovoltaic array of claim 1 wherein said (I) silicone composition further comprises a plurality of fibers.

8. The photovoltaic array of claim 1 wherein said second outermost layer comprises a non-woven textile mat at least partially coated with said (I) silicone composition.

9. The photovoltaic array of claim 8 wherein said non-woven textile mat is chosen from fiberglass, polyester, polyethylene, polypropylene, nylon, and combinations thereof.

10. The photovoltaic array of claim 1 wherein said (I) silicone composition is free of fibers.

11. The photovoltaic array of claim 1 further comprising a tie layer disposed on said photovoltaic cells and sandwiched between said photovoltaic cells and said first outermost layer such that said tie layer is disposed on and in direct contact with both said photovoltaic cells and said first outermost layer.

12. The photovoltaic array of claim 11 wherein said tie layer comprises a second silicone composition which is the same or different as said (I) silicone composition.

13. A photovoltaic array comprising:
   A. a first outermost layer that is a single layer having a light transmittance of at least 70 percent as determined by UV/Vis spectrophotometry using ASTM E424-71, and consisting essentially of silicone;
   B. two or more photovoltaic cells electrically connected to each other, each disposed on and in direct contact with said first outermost layer; and
   C. a second outermost layer that is a single layer disposed opposite said first outermost layer, said second outermost layer formed from an at least partially cured (I) silicone composition and disposed on and in direct contact with said photovoltaic cells sandwiching said photovoltaic cells between said second outermost layer and said first outermost layer, and
   wherein said at least partially cured (I) silicone composition is formed from at least partially curing a combination of a linear organosilicon compound having two terminal unsaturated moieties per molecule and present in an amount of from 80 to 95 parts by weight, a branched organosilicon compound having two terminal unsaturated moieties per molecule and at least one pendant unsaturated moiety per molecule and present in an amount of from 5 to 20 as parts by weight, per 100 parts by weight of a sum of said linear organosilicon compound and said branched organosilicon compound, and an organohydrogensilicon compound having at least three silicon-bonded hydrogen atoms per molecule wherein a ratio of silicon-bonded hydrogen atoms per molecule of said organohydrogensilicon compound to a sum of unsaturated moieties per molecule of said linear organosilicon compound and branched organosilicon compound is from 1 to 1.7,
   wherein said array is free of any layers that include polymers other than silicone polymers,
   wherein said first outermost layer is positioned on the top of said array and said array is free of any additional layers disposed on the top of said array, and
   wherein said second outermost layer is positioned on the bottom of said array and said array is free of any additional layers disposed on the bottom of said array.

14. A method of forming a photovoltaic array comprising a first outermost layer that is a single layer having a light transmittance of at least 70 percent as determined by UV/Vis spectrophotometry using ASTM E424-71 and that is silicone, two or more photovoltaic cells electrically connected to each other, each disposed on the first outermost layer, and a second outermost layer that is a single layer disposed opposite the first outermost layer, formed from an at least partially cured liquid silicone composition, and disposed on and in direct contact with the photovoltaic cells sandwiching the photovoltaic cells between the second outermost layer and the first outermost layer, said method comprising the steps of:
   A. electrically connecting the photovoltaic cells to each other,
   B. disposing the photovoltaic cells on the first outermost layer;
   C. disposing the liquid silicone composition on and in direct contact with the photovoltaic cells;
   D. compressing the first outermost layer, the photovoltaic cells, and the liquid silicone composition to at least partially cure the liquid silicone composition and form the second outermost layer and the array,
   wherein the liquid silicone composition comprises a linear organosilicon compound having two terminal unsaturated moieties per molecule and present in an amount of from 80 to 95 parts by weight, a branched organosilicon compound having two terminal unsaturated moieties per molecule and at least one pendant unsaturated moiety per molecule and present in an amount of from 5 to 20 as parts by weight, per 100 parts by weight of a sum of said linear organosilicon compound and said branched organosilicon compound, and an organohydrogensilicon compound having at least three silicon-bonded hydrogen atoms per molecule wherein a ratio of silicon-bonded hydrogen atoms per molecule of said organohydrogensilicon compound to a sum of unsaturated moieties per molecule of said linear organosilicon compound and branched organosilicon compound is from 1 to 1.7,
   wherein the photovoltaic array is free of any layers that include polymers other than silicone polymers,
   wherein the first outermost layer is positioned on the top of the array and the array is free of any additional layers disposed on the top of the array, and
   wherein the second outermost layer is positioned on the bottom of the array and the array is free of any additional layers disposed on the bottom of the array.

15. The method of claim 14 wherein the second outermost layer further comprises a non-woven textile mat at least partially coated with the liquid silicone composition and wherein said method further comprises at least partially coating the mat with the liquid silicone composition to form the second outermost layer, wherein the mat is at least partially coated after or simultaneously with the step of disposing the liquid silicone composition on the photovoltaic cells.

16. The method as set forth in claim 15 wherein the step of disposing the photovoltaic cells on the first outermost layer is further defined as disposing the photovoltaic cells directly on the first outermost layer via chemical vapor deposition or physical sputtering.

17. The photovoltaic array of claim 1 wherein said first outermost layer is disposed on and in direct contact with said photovoltaic cells.

18. A photovoltaic array comprising:
a first outermost layer that is a single layer having a light transmittance of at least 70 percent as determined by UV/Vis spectrophotometry using ASTM E424-71 and that is silicone;
two or more photovoltaic cells electrically connected to each other, each disposed on said first outermost layer;
a first tie layer disposed on said photovoltaic cells and sandwiched between said photovoltaic cells and said first outermost layer such that said first tie layer is disposed on and in direct contact with both said photovoltaic cells and said first outermost layer,
a second outermost layer that is a single layer disposed opposite said first outermost layer, said second outermost layer comprising a (I) silicone composition and disposed on said photovoltaic cells sandwiching said photovoltaic cells between said second outermost layer and said first outermost layer,
a second tie layer disposed on said photovoltaic cells and sandwiched between said photovoltaic cells and said second outermost layer such that said second tie layer is disposed on and in direct contact with both said photovoltaic cells and said second outermost layer,
wherein said (I) silicone composition comprises a linear organosilicon compound having two terminal unsaturated moieties per molecule and present in an amount of from 80 to 95 parts by weight, a branched organosilicon compound having two terminal unsaturated moieties per molecule and at least one pendant unsaturated moiety per molecule and present in an amount of from 5 to 20 as parts by weight, per 100 parts by weight of a sum of said linear organosilicon compound and said branched organosilicon compound, and an organohydrogensilicon compound having at least three silicon-bonded hydrogen atoms per molecule wherein a ratio of silicon-bonded hydrogen atoms per molecule of said organohydrogensilicon compound to a sum of unsaturated moieties per molecule of said linear organosilicon compound and branched organosilicon compound is from 1 to 1.7, wherein said first outermost layer is positioned on the top of said array and said array is free of any additional layers disposed on the top of said array, wherein said second outermost layer is positioned on the bottom of said array and said array is free of any additional layers disposed on the bottom of said array, wherein said first tie layer comprises a second silicone composition which is the same or different as said (I) silicone composition, and wherein said second tie layer comprises an additional silicone composition which is the same or different as said (I) silicone composition and/or said second silicone composition.

* * * * *